US008847068B2

(12) United States Patent
Swager et al.

(10) Patent No.: US 8,847,068 B2
(45) Date of Patent: Sep. 30, 2014

(54) COMPOSITIONS, METHODS, AND SYSTEMS COMPRISING POLY(THIOPHENES)

(75) Inventors: Timothy M. Swager, Newton, MA (US); Jose M. Lobez, Boston, MA (US); Fei Wang, Stoneham, MA (US); Trisha L. Andrew, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 235 days.

(21) Appl. No.: 13/248,473

(22) Filed: Sep. 29, 2011

(65) Prior Publication Data

US 2012/0073662 A1   Mar. 29, 2012

Related U.S. Application Data

(60) Provisional application No. 61/387,851, filed on Sep. 29, 2010.

(51) Int. Cl.
| | |
|---|---|
| *H01B 1/12* | (2006.01) |
| *H01B 1/04* | (2006.01) |
| *H01L 51/46* | (2006.01) |
| *H01L 51/00* | (2006.01) |
| *C08L 65/00* | (2006.01) |
| *H01L 51/42* | (2006.01) |
| *C08K 3/04* | (2006.01) |

(52) U.S. Cl.
CPC ...... *H01L 51/0036* (2013.01); *C08G 2261/124* (2013.01); *C08L 2205/03* (2013.01); *Y02E 10/549* (2013.01); *C08G 2261/91* (2013.01); *C08G 2261/1424* (2013.01); *C08L 65/00* (2013.01); *C08G 2261/3223* (2013.01); *H01L 51/4253* (2013.01); *C08G 2261/1422* (2013.01); *C08K 3/04* (2013.01)
USPC .......................... 136/263; 252/500; 252/511

(58) Field of Classification Search
None
See application file for complete search history.

(56) References Cited

U.S. PATENT DOCUMENTS

| | | |
|---|---|---|
| 2006/0076050 A1 | 4/2006 | Williams et al. |
| 2009/0108255 A1 | 4/2009 | Bazan et al. |
| 2009/0230361 A1 | 9/2009 | Seshadri et al. |
| 2009/0246532 A1 | 10/2009 | Lutsen et al. |

FOREIGN PATENT DOCUMENTS

WO    WO 2005/073338 A2    8/2005

OTHER PUBLICATIONS

Berggren et al., "Light-emitting diodes with variable colours from polymer blends," Nature, vol. 372, p. 444, Dec. 1, 1994.*
Kronholm et al., "Fullerene-Based n-Type Semiconductors in Organic Electronics," Material Matters, 2007, 2.3, 16.*
International Search Report and Written Opinion for PCT/US2011/053899 mailed Dec. 15, 2011.
Andersson et al., Electroluminescence from Substituted Poly(thiophenes): From Blue to Near-Infrared. Macromolecules. 1995;28 (22):7525-29.
Bauerle et al., Einfache Synthese von 3-( [omega]-Halogenalkyl)thiophenen als Grundbausteinen für funktionalisierte Thiophene und Polythiophene. Angew Chem Intl Ed Eng. 1990;102(4):414-15.

(Continued)

*Primary Examiner* — Ling Choi
*Assistant Examiner* — Catherine S Branch
(74) *Attorney, Agent, or Firm* — Wolf, Greenfield & Sacks, P.C.

(57) ABSTRACT

The present invention generally relates to compositions comprising at least one poly(thiophene) and an n-type material. The compositions can be used in a variety of applications, for example, in photovoltaic cells.

38 Claims, 27 Drawing Sheets

(56) References Cited

OTHER PUBLICATIONS

Bjornholm et al., Self-Assembly of Regioregular, Amphiphilic Polythiophenes into Highly Ordered π-Stacked Conjugated Polymer Thin Films and Nanocircuits. J Am Chem Soc. 1998;120(30):7643-7644.

Campoy-Quiles et al., Ternary mixing: A simple method to tailor the morphology of organic solar cells. Organic Electronics. 2009;10:1120-1132.

Cheng et al., Synthesis of conjugated polymers for organic solar cell applications. Chem Rev. Nov. 2009;109(11):5868-923.

Duhm et al., Orientation-dependent ionization energies and interface dipoles in ordered molecular assemblies. Nat Mater. Apr. 2008;7(4):326-32. Epub Feb. 10, 2008.

Grimsdale et al., Synthesis of light-emitting conjugated polymers for applications in electroluminescent devices. Chem Rev. Mar. 11, 2009;109(3):897-1091.

Iovu et al., Conducting Regioregular Polythiophene Block Copolymer Nanofibrils Synthesized by Reversible Addition Fragmentation Chain Transfer Polymerization (RAFT) and Nitroxide Mediated Polymerization (NMP). Macromolecules. 2007;40(14):4733-4735.

Kim et al., A strong regioregularity effect in self-organizing conjugated polymer films and high-efficiency polythiophene:fullerene solar cells. Nature Materials. 2006;5:197-203.

Kim et al., Hyperconjugative and inductive perturbations in poly(p-phenylene vinylenes). J Am Chem Soc. Jan. 21, 2004;126(2):452-3.

Lee et al., Processing Additives for Improved Efficiency from Bulk Heterojunction Solar Cells. J. Am Chem Soc. 2008;130 (11):3619-23.

Mayer et al., Bimolecular Crystals of Fullerenes in Conjugated Polymers and the Implications of Molecular Mixing for Solar Cells. Adv Funct Mater. 2009;19:1173-79.

McQaude et al., Conjugated polymer-based chemical sensors. Chem Rev. Jul. 12, 2000;100(7):2537-74.

Mishra et al., Functional oligothiophenes: molecular design for multidimensional nanoarchitectures and their applications. Chem Rev. Mar. 11, 2009;109(3):1141-276.

Pivrikas et al., Substituting the postproduction treatment for bulk-heterojunction solar cells using chemical additives. Organic Electronics. 2008;9:775-82.

Ribeiro et al., New functionalized 3-(alkyl)thiophene derivatives and spectroelectrochemical characterization of its polymers. Syn Metals. 2004;145(1):43-49.

Stokes et al., New Phosphonic Acid Functionalized, Regioregular Polythiophenes. Macromolecules. 2003;36(19):7114-7118.

Takahashi et al., Preparation of Nanoporous Poly(3-hexylthiophene) Films Based on a Template System of Block Copolymers via Ionic Interaction. Macromolecules. 2010;43(11):4843-4852.

Tremblay et al., Photovoltaic Universal Joints: Ball-and-Socket Interfaces in Molecular Photovoltaic Cells. Chem Phys Chem. 2010;11:799-803.

Tsai et al., Enhancement of P3HT/PCBM Photovoltaic Efficiency Using the Surfactant of Triblock Copolymer Containing Poly(3-hexylthiophene) and Poly(4-vinyltriphenylamine) Segments. Macromolecules. 2010;43:6085-91.

Vandewal et al., On the origin of the open-circuit voltage of polymer-fullerene solar cells. Nat Mater. Nov. 2009;8(11):904-9. Epub Oct. 11, 2009.

Veen et al., Solid state organisation of $C_{60}$ by inclusion crystallisation with triptycenes. Chem Commun. 1999:1709-10.

Wang et al., Molecular recognition for high selectivity in carbon nanotube/polythiophene chemiresistors. Angew Chem Int Ed Engl. 2008;47(44):8394-6.

Wang et al., Synthesis, Properties, and Tunable Supramolecular Architecture of Regioregular Poly(3-alkylthiophene)s with Alternating Alkyl and Semifluoroalkyl Substituents. Macromolecules. 2008;41(14):5156-5165.

Wu et al., Crystalline Random Conjugated Copolymers with Multiple Side Chains: Tunable Intermolecular Interactions and Enhanced Charge Transport and Photovoltaic Properties. Macromolecules. 2010;43(7):3306-13.

Yang et al., Well-defined donor-acceptor rod-coil diblock copolymers based on P3HT containg $C_{60}$: the morphology and role as a surfactant in bulk-heterojunction solar cells. J Mater Chem. 2009;19:5416-23.

Yi et al., Exciton-Dissociation and Charge-Recombination Processes in Pentacene/$C_{60}$ Solar Cells: Theoretical Insight into the Impact of Interface Geometry. J Am Chem Soc. 2009;131(43): 15777-83.

International Preliminary Report on Patentability mailed Apr. 11, 2013 for Application No. PCT/US2011/053899.

\* cited by examiner

COMPOSITIONS, METHODS, AND SYSTEMS COMPRISING POLY(THIOPHENES)

RELATED APPLICATIONS

This application claims priority under 35 U.S.C. §119(e) to U.S. Provisional Patent Application No. 61/387,851, filed Sep. 29, 2010, and entitled "Compositions, Methods, and Systems Comprising Poly(Thiophenes)," which application is incorporated herein by reference in its entirety for all purposes.

FIELD OF THE INVENTION

The present invention generally relates to compositions comprising at least one poly(thiophene) and an n-type material. The compositions can be used in a variety of applications, for example, in photovoltaic cells.

BACKGROUND OF THE INVENTION

Photovoltiac cells can be used convert light energy into electrical energy. Much work has been completed previously on photovoltaic cells comprising a material having a poly(thiophene) (PT)/phenyl-$C_{61}$-butyric acid methyl ester (PCBM) bulk heterojunction (BHJ). The performance of photovoltaic cells comprising these materials is generally dependent on the morphology of the materials and in particular, the interface between the materials.

Organic electronics have been the focus of much research over the past few decades. Compared to traditional metal-based and silicon-based electronics, the cost of organic electronics is much lower, and the fabrication process is largely simplified. Another distinct advantage of the organic-based devices is their ultra-thin and flexible nature. Typical organic electronic devices include organic light-emitting diodes (OLEDs), thin film transistors (TFTs), and organic photovoltaics (OPVs). Since they are generally composed of one or more organic layers sandwiched between metal or oxide electrodes, the properties of the metal-organic and the organic-organic interfaces are critical to charge transport and to charge carrier dissociation/recombination processes.

SUMMARY OF THE INVENTION

In some embodiments, a composition is provided comprising an n-type material, a first poly(thiophene), wherein the first poly(thiophene) is a regioregular copolymer having an alternating A/B pattern, and a second poly(thiophene) that is different from the first poly(thiophene).

In other embodiments, a composition is provided comprising a first polymeric material, having the structure:

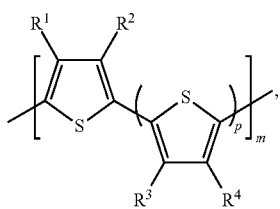

a second polymeric material, having the structure:

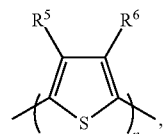

and an n-type material, wherein $R^1$ and $R^2$ can be the same or different and each can independently be hydrogen, alkyl, heteroalkyl aryl, heteroaryl, arylalkyl, arylheteroalkyl, heteroarylalkyl, each optionally substituted, provided at least one of $R^1$ and $R^2$ is not hydrogen, $R^3$, $R^4$, $R^5$, and $R^6$ can be the same or different and each can independently be hydrogen, alkyl, heteroalkyl, cycloalkyl, or heterocycloalkyl, each optionally substituted, n and m can be the same or different and can be any integers between 2 and 100,000,000, and p is 1, 3, or 5.

In yet other embodiments, a composition is provided comprising an n-type material, a first poly(thiophene), functionalized with an electron-donating and/or an electron-accepting moiety, selected to be capable of interacting electrochemically with the n-type material, and a second poly(thiophene) that is different from the first poly(thiophene).

In some embodiments, a photovoltaic cell is provided comprising a composition as described above.

Other aspects, embodiments, and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention generally relates to compositions and materials comprising poly(thiophenes), which may find use in a variety of applications, for example, in photovoltaic cells. Generally, the compositions comprise at least one poly(thiophene) and at least one n-type material. Some embodiments involve the use of a polymer additive to improve the performance (e.g., efficiency) of organic electronic devices comprising poly(thiophene)s. For example, the additive may interact with a portion of the device via hydrogen bonding, host-guest interactions, and/or solvation interactions, which may significantly improve the performance of the device. The subject matter of the present invention involves, in some cases, interrelated products, alternative solutions to a particular problem, and/or a plurality of different uses of one or more systems and/or articles.

Figure 3:
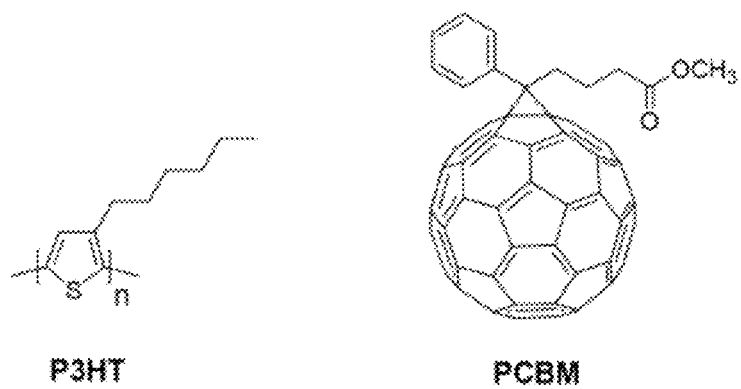
FIG. 3 shows the structures of P3HT and PCBM.

In some cases, an additive may be combined with a donor-acceptor system to improve the efficiency of the system. For example, a widely studied donor-acceptor pair involves poly (3-hexylthiophene) (P3HT) and PCBM, as shown in FIG. 3. The additive (e.g., polymer additive) may be incorporated in relatively low amounts, such as about 5 wt % or less, about 2.5 wt % or less, about 1 wt % or less, 0.50 wt % or less, about 0.40 wt % or less, about 0.30 wt % or less (e.g., 0.25 wt %), about 0.20 wt % or less, about 0.10 wt % or less, or the like. In one set of embodiments, a composition may include about 0.25 wt % of a polymer additive as described herein. The additive may have a chemical structure that is different than the donor and the acceptor.

In some embodiments, the composition comprises a first poly(thiophene) and a second poly(thiophene), wherein the first poly(thiophene) and the second poly(thiophene) are different. The first poly(thiophene) and the second poly (thiophene) may be selected so as to provide a selected combination of properties which improves the performance of the composition as compared to a similar composition which contains only the first poly(thiophene) or the second poly (thiophene).

Poly(thiophenes) will be known to those of ordinary skill in the art and generally contain the repeating unit:

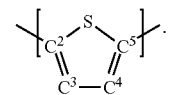

In some cases, at least one of $C^3$ or $C^4$ may be substituted. As will be known to those of ordinary skill in the art, poly (thiophenes) can be used in connection with n-type materials to form bulk heterojunctions, the resulting compositions finding use in a variety of applications including photovoltaic cells (e.g., solar cells). The performance of the photovoltaic cell may depend on the morphology of the materials and/or the interaction between the poly(thiophene) and the n-type material. For example, in some cases, the performance of a photovoltaic cell improves with increasing regioregularity (RR) of the poly(thiophene). This may be due, at least in part, to an increased hole mobility for highly ordered poly (thiophene).

In some embodiments, the invention generally relates to functionalization of a poly(thiophene) and/or the use of more than one poly(thiophene) with a system comprising an n-type material, which can result in control of the polymer superstructure, crystallite size, and/or improved charge separation of photo-excited states at the heterojunctions. That is, the nature and length of the functional groups of a poly (thiophene) and/or the addition of at least a second poly (thiophene) to the system can affect the performance parameters of the system. For example, altering the functional groups of a poly(thiophene) can influence the morphology and/or optoelectronic properties of the polymer, and/or its performance in photovoltaic devices. As another example, different geometries on side chain substitution (e.g., on one type of poly(thiophene)) may affect the interaction between a second poly(thiophene) (e.g., a different type of poly (thiophene)) and the n-type material, and thus increase or decrease the blending of the materials, leading to altered performance parameters.

Accordingly to some embodiments of the invention, the incorporation of more than one type of poly(thiophene) to a composition comprising a second poly(thiophene) and an n-type material may aid in improving the blending of the materials. For example, the additional poly(thiophene) material may blend in with the second poly(thiophene) and/or may interact with the n-type material, thereby organizing itself at the interface between the second poly(thiophene) and the n-type material, as described herein.

In some embodiments, a composition of the present invention comprises an n-type material, a first poly(thiophene), and a second poly(thiophene) which is different from the first poly(thiophene), wherein the first poly(thiophene) is a regioregular copolymer having an alternating A/B pattern. Those of ordinary skill in the art will be aware of the structure of a regioregular poly(thiophene) copolymer having an alternating A/B pattern. For example, a 3-substituted regioregular A/B poly(thiophene) copolymer comprises repeating (AB) units wherein each monomer is contained within the polymer in a regioregular manner (e.g., each monomer is attached to the main polymer at the $C^2$- or $C^5$-position, and the monomer substituents are attached to the monomer following the same head to tail to head to tail, etc., fashion). Generally, regioregular poly(thiophenes) substituted at the $C^3$ position are oriented such that the aromatic rings are substantially planar and the functional groups point in alternating directions (e.g., the A block substituents point "up" and the B block substituents point "down").

Without wishing to be bound by theory, it is believed that a regioregular A/B poly(thiophene) copolymer, with the appropriate selection of functional groups on the A/B blocks, can lead to the formation of a layer of the first poly(thiophene) between the n-type material and the second poly(thiophene). In some cases, the morphology of the system comprising is substantially similar to a system comprising only the second poly(thiophene) and the n-type material, and may result in improved or favorable interactions at the interface between the second poly(thiophene) and the n-type material.

For example, in some embodiments, the A block of the first poly(thiophene) comprises functional groups which are capable of interacting with functional groups on the second poly(thiophene) thus providing for a favorable interaction between the second poly(thiophene) and the first poly (thiophene), and the B block of the first poly(thiophene) comprises functional groups which are capable of interacting with functional groups present on the n-type material, thus providing for a favorable interaction between the n-type material and the first poly(thiophene). Without wishing to be bound by theory, the alternating directionality that is generally present for A/B regioregular poly(thiophenes) (e.g., "up" orientation of A blocks and "down" orientation of B blocks) may allow for the first poly(thiophene) to interact with the second poly(thiophene) in essentially the same manner as if the first poly(thiophene) was an homopolymer of A monomers and/or allow the first poly(thiophene) to interact with the n-type type material in essentially the same manner as if the first poly(thiophene was a homopolymer of B monomers. In some embodiments, the A block comprises the same or substantially similar functional groups as comprised on the second poly(thiophene) (e.g., both the A block and the second poly(thiophene) are functionalized with hexyl groups at the 3-position).

In some cases, incorporation of the first poly(thiophene) having a regioregular A/B structure into a system comprising a second poly(thiophene) and an n-type material does not significantly affect the morphology of the system. That is, the morphology of system comprising the first poly(thiophene), the second poly(thiophene), and the n-type material is substantially similar to the morphology of a system comprising the second poly(thiophene) and the n-type material. Those of ordinary skill in the art will be aware of methods for determining whether the morphology of the system is affected (e.g., using XRD analysis of the two systems) upon incorporation of the first poly(thiophene). The performance of the first system (e.g., comprising two poly(thiophenes)) and the n-type material may be improved as compared to the second system (e.g., comprising only the second poly(thiophene)) as the charge separation may increase.

Figure 1A:
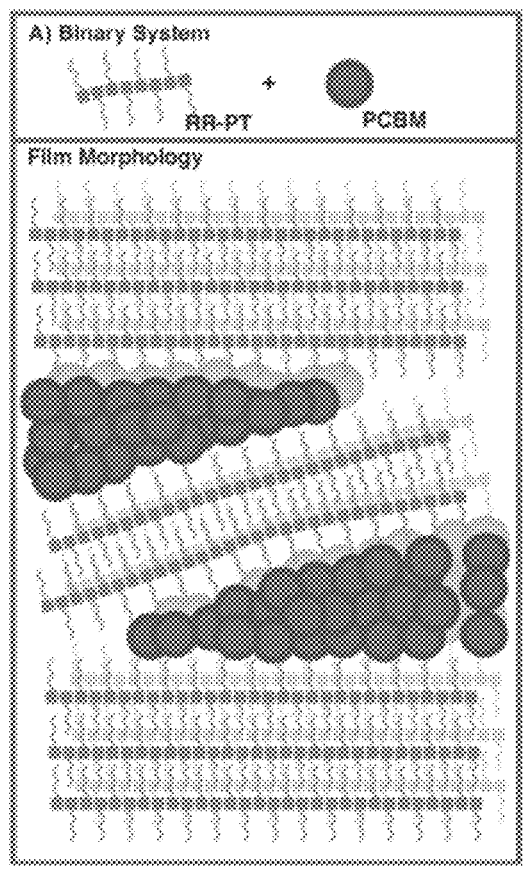
FIGS. 1A and 1C show non-limiting examples of schematics of compositions comprising a first poly(thiophene) and an n-type material.
Figure 1B:
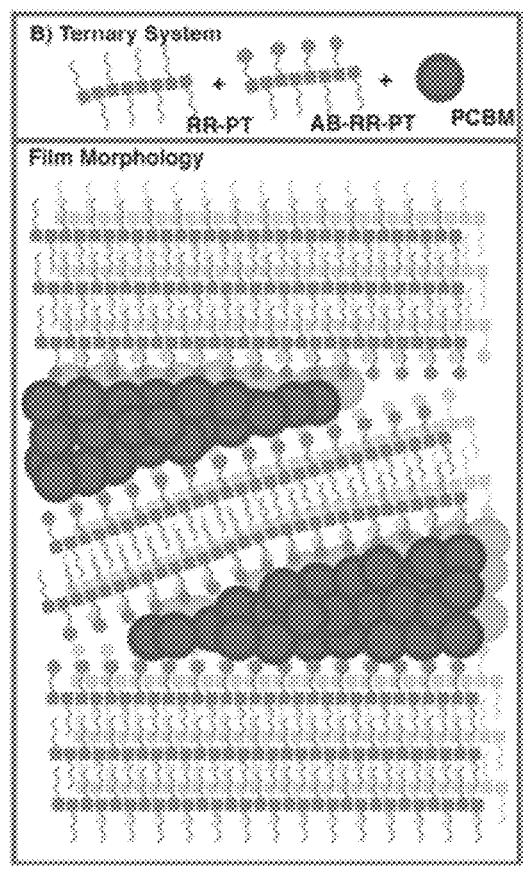
FIGS. 1B and 1D show non-limiting examples of schematics of compositions comprising a first poly(thiophene), a second poly(thiophene), and an n-type material.
Figure 1C:
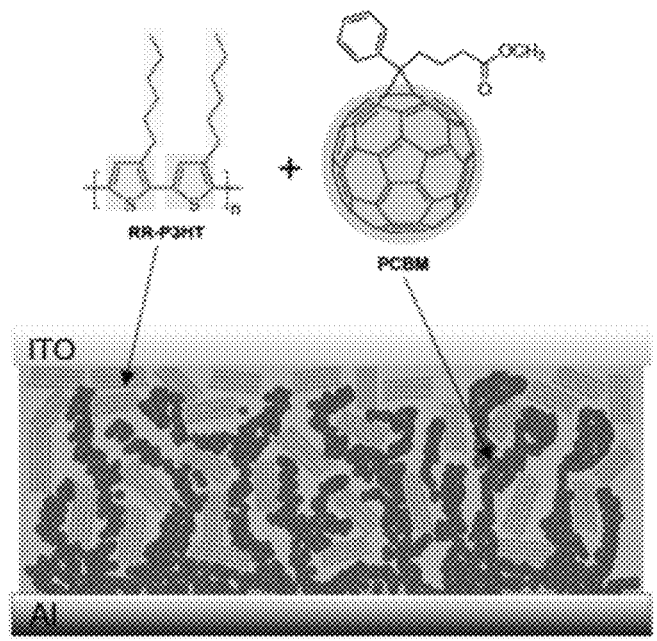
Figure 1D:
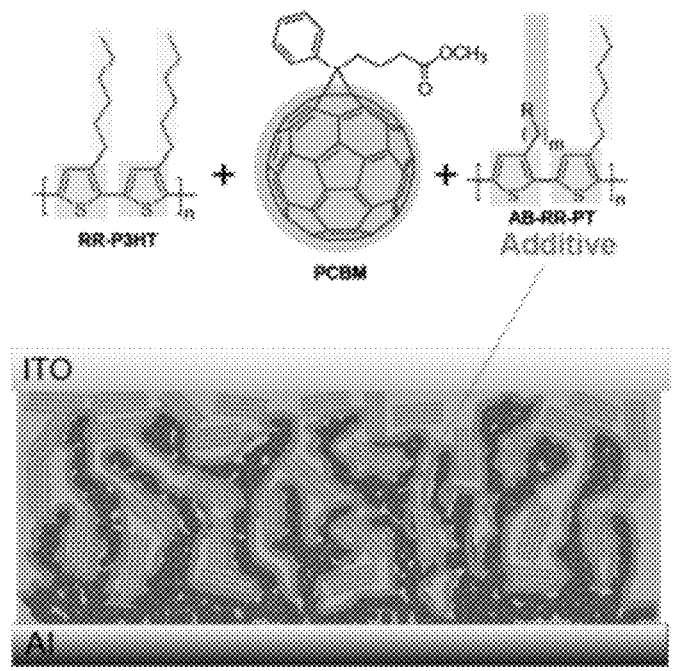

For example, FIG. 1A shows a system comprising a single poly(thiophene) and an n-type material (in this embodiment, PCBM). In this system, the PCBM is dispersed between layers of the poly(thiophene). In FIG. 1B, the system comprises a first poly(thiophene) comprising functionalized groups which are capable of interacting with the n-type material (e.g., in this case, PCBM), and a second poly(thiophene). The first poly(thiophene) in incorporated into the material in layers formed near or about the segments of PCBM and does substantially alter the morphology of the second poly (thiophene). FIGS. 1C and 1D, respectively, show specific examples of the systems shown in FIGS. 1A and 1B.

In some embodiments, the composition comprises an n-type material, a first polymeric material having the structure:

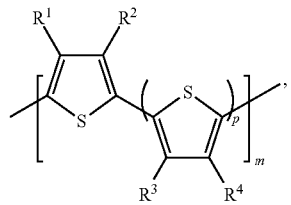

and a second polymeric material, having the structure:

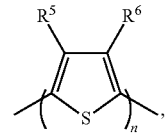

wherein $R^1$ and $R^2$ can be the same or different and each can independently be hydrogen, alkyl, heteroalkyl, aryl, heteroaryl, arylalkyl, arylheteroalkyl, heteroarylalkyl, each optionally substituted, provided at least one of $R^1$ and $R^2$ is not hydrogen, $R^3$, $R^4$, $R^5$, and $R^6$ can be the same or different and each can independently be hydrogen, alkyl, heteroalkyl, cycloalkyl, or heterocycloalkyl, each optionally substituted, n and m can be the same or different and can be any integer between 2 and 100,000,000, and p is 1, 3, or 5. In some embodiments, $R^1$ and $R^2$ can be the same or different and each can independently be hydrogen, aryl, heteroaryl, arylalkyl, arylheteroalkyl, heteroarylalkyl, each optionally substituted, provided at least one of $R^1$ and $R^2$ is not hydrogen In some embodiments, each $R^1$ and each $R^3$ is H, and/or each $R^5$ is H. In some embodiments $R^1$ is H and $R^2$ is aryl, heteroaryl, arylalkyl, arylheteroalkyl, heteroarylalkyl, optionally substituted. In some embodiments, $R^3$ is H and $R^4$ is alkyl, heteroalkyl, cycloalkyl, or heterocycloalkyl, optionally substituted. In some cases, $R^3$ is H and $R^4$ is alkyl, optionally substituted. In a particular embodiment, $R^4$ is ethyl, propyl, butyl, pentyl, hexyl, heptyl, octyl, nonyl, decyl, undecyl, etc., including isomers thereof.

In some embodiments, $R^1$ is H and $R^2$ is:

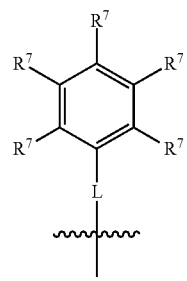

wherein L is a linking group and each $R^7$ can be the same or different and is hydrogen, halo, alkyl, aryl (e.g., phenyl, naphthyl, iptycenyl, triptycenyl, pentiptycenyl, etc.), heteroalkyl (e.g., alkoxy), heteroaryl, each optionally substituted. In some cases, each $R^7$ is halo, such as fluoro. Those of ordinary skill in the art will be aware of suitable linking groups. Non-limiting examples of linking groups include alkyl, heteroalkyl (e.g., ether chains), or the like.

In some cases, $R^1$ is H and $R^2$ is -L-X-aryl, wherein L is a linking group (e.g., as described herein), X is a heteroatom (e.g., O, N, S, etc.), optionally present, and aryl is an aryl group, optionally substituted. In a particular embodiment L is alkyl (e.g., $(CH_2)_w$, wherein w is an integer (e.g., 1, 2, 3, 4, 5, 6, 7, 8, 9, 10, 11, 12, etc.)), X is O, and the aryl group is optionally substituted. In some cases, w is an integer between 1 and 24, or between 2 and 24, or between 1 and 12, or between 2 and 12, or between 4 and 10, or any combination of the integers listed above.

In a particular embodiment $R^1$ is H and $R^2$ is:

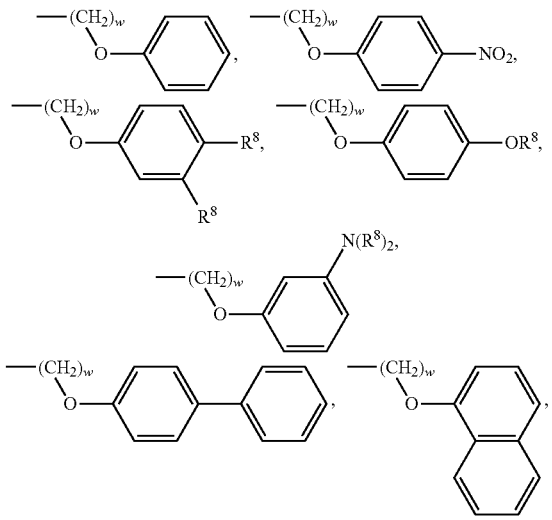

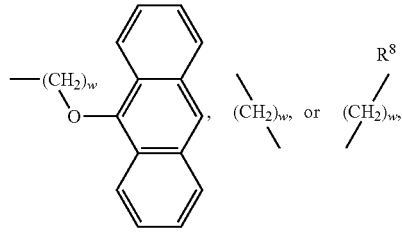

wherein each $R^8$ is the same or different and is halo, alkyl or aryl, optionally substituted, and w is as defined herein. In some cases, at least one other hydrogen on any aryl ring of the groups described above may be optionally substituted.

In some embodiments, a poly(thiophene) may comprise one or more fluorinated groups. That is, at least one of $R^1$-$R^6$ may comprising a fluorinated group, for example, a fluorocarbon chain or a fluorinated aryl group. In some cases, at least one of $R^1$ to $R^6$ is:

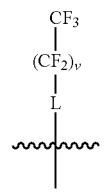

wherein v is an integer (e.g., 1, 2, 3, 4, 5, 6, 7, 8, 9, 10, 11, 12, etc.) and L is a linking group as described herein, optionally present. In some cases, v is at least 2, or at least 3, or at least 4, or at least 5, or at least 6, etc. In some cases, v is between 1 and 24, or between 2 and 24, or between 1 and 12, or between 2 and 12, or between 4 and 10, or any combination of the integers listed above.

In a particular embodiment, $R^1$ is H and $R^2$ is:

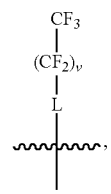

wherein v is at least 4 and L is a linking group, optionally present. The presence of at least one highly fluorinated group associated with the polymer chain may aid in increasing the solubility of the polymer in fluorous solvents.

In some embodiments, n and m are the same or different and are an integer between 10 and 1,000,000, or between 100 and 100,000, or between 100 and 10,000, or between 10 and 1000, etc. In some cases, p is 1 or 3, or is 1. The molecular weight of the first poly(thiophene) or the second poly(thiophene) may be between about 500 and about 100,000,000, or between about 500 or about 10,000,000, or between about 500 and about 1,000,000, or between about 500 and about 500,000, or between about 500 and about 100,000, or between about 10,000 and about 100,000, or the like.

In one set of embodiments, the polymer has the structure,

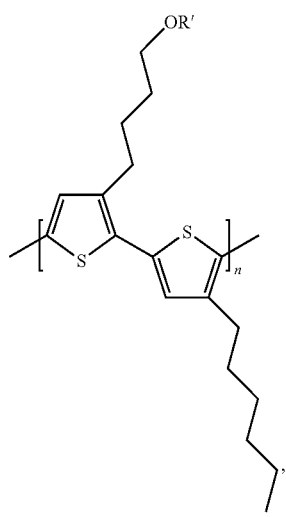

wherein R' is phenyl, halo-phenyl (e.g., 4-iodophenyl, 2,3,4,5,6-pentafluorophenyl), alkoxy-phenyl (e.g., 4-methoxyphenyl), naphthyl, or an iptycene group (e.g., alkoxy-triptycene); and n is greater than 1.

In one embodiment, the polymer has the structure,

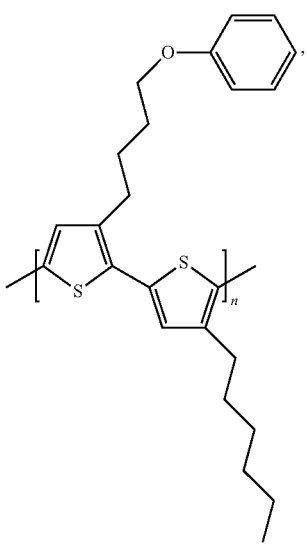

where n is greater than 1.

In one embodiment, the polymer has the structure,

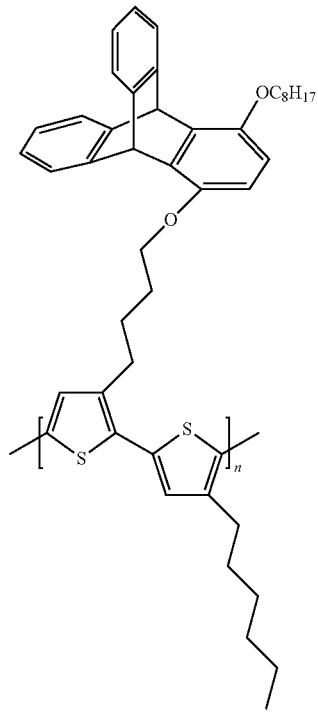

where n is greater than 1.

In one embodiment, the polymer has the structure,

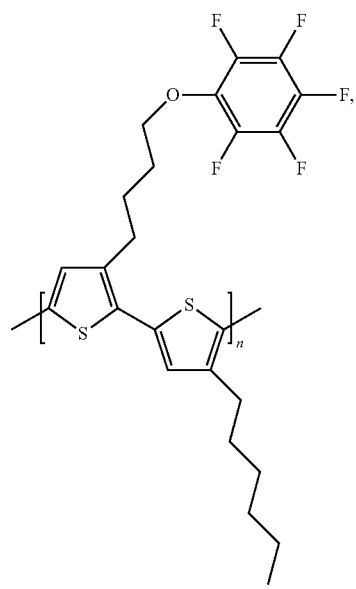

where n is greater than 1.

In some embodiments, the second poly(thiophene) is a homopolymer. In some cases, the second poly(thiophene) is functionalized at the 3- and/or 4-position with alkyl, heteroalkyl, cycloalkyl, or heterocycloalkyl, optionally substituted. In some cases, the substituents are chosen so as to increase the solubility of the second poly(thiophene). In some cases, the second poly(thiophene) is a poly(3-alkylthiophene). For example, the second poly(thiophene) may be poly(3-hexylthiophene), poly(3-proylthiophene), poly(3-butylthiophene), poly(3-pentylthiophene), poly(3-heptylthiophene), poly(3-octylthiophene), poly(3-nonylthiophene), poly(3-decyllthiophene), or the like. The functional groups may or may not comprise a heteroatom (e.g., oxygen, nitrogen).

In some cases, the first poly(thiophene) is functionalized with electron-donating or electron-accepting moieties selected to be capable of interacting electrochemically with the n-type material. The term "selected to capable of interacting electrochemically" with the n-type material, as used herein, refers to functional groups which give rise to enhanced charged separation as compare to a substantially similar system in which the functional groups are not present. The terms "electron-accepting moiety" and "electron-donating moiety" are given their ordinary meaning in the art and refer to groups or moieties which have a tendency to attract or donate, respectively, an electron from another group of the same or a different molecule.

Without wishing to be bound by theory, certain interactions, for example, hydrogen-bonds between a poly(thiophene) and an n-type material, can give rise to enhanced charge separation. Charge separation wherein an electron and hole are separated to two different phases is necessary to achieve photovoltaic properties in materials. The incorporation of selected functional groups into the poly(thiophene) can give rise to greater efficiencies in these processes. In some cases, the additional poly(thiophene) may be selected such that it comprises functional groups which are capable of interacting with the n-type material. For example, the additional poly(thiophene) may comprise functional dipolar groups in the side chain which favor interaction at the interface with an n-type material (e.g., phenyl-$C_{61}$-butyric acid methyl ester). The addition of the side chains may decrease exciton energy and promote charge separation with preventing charge recombination, which can be one of the limiting factors in open circuit voltage.

In some embodiments, the enhanced charge separation can be determined by examining the quenching of a luminescent donor polymer in the presence of the n-type material (e.g., the hydrogen bound fullerene acceptor molecules). In some cases, the specific nature of the hydrogen bonding can also be confirmed by competitive hydrogen bonding with the addition of appropriate hydrogen-bond accepting solvents, such as tetrahydrofuran. These same interactions can take place at interfaces between two bulk phases of polymeric materials thereby facilitating charge separation and preventing recombination. In some cases, hydrogen-bonding functional groups can be attached in close proximity to the polymer backbone, or alternatively, the hydrogen-bonding functional groups may be separated from the polymer backbone by a selective linkers (e.g., alkyl and/or aryl linkers).

In some cases, electron-donating or electron-accepting groups can give rise to improved charge separation properties. In such embodiments, an electron-donating or electron-accepting functional group (or moiety) is attached to a polymer chain via an intervening linker (e.g., alkyl or aryl linker). The electron-donating or electron-accepting moieties for complementary charge transfer interactions are blended with the corresponding accepting or donating phases that are assembled into bulk phase separated structures in the solid state. The charge transfer interactions in these assembled structures can then create an interfacial dipole that facilitates charge separation of excited states that diffuse to these interfaces. This enhanced charge separation can increase the efficiency of the photovoltaic response to the material by preventing back electron transfer reactions and/or charge recombination.

Those of ordinary skill in the art will be aware of methods to select functional groups which are capable of interacting with the n-type type material. For example, the functional group may comprise hydrogen-bond acceptors and the n-type material comprises hydrogen-bond donors. Non-limiting examples of interactions which may occur between the first poly(thiophene) and the n-type material are hydrogen-bond donor/hydrogen-bond acceptor interaction, a pi-stacking interaction, or the like. For example, the n-type material may contain a carboxylic acid functionality and the poly(thiophene) functional groups may contain hydroxyl group.

In some cases, the interaction between a first poly(thiophene) and an n-type material may be determined using the Stern-Volmer equation. That is, the interaction between the first poly(thiophene) and the n-type material may be determined by determining the quenching of the first poly(thiophene) by the presence of n-type material. Those of ordinary skill in the art will be aware of methods and systems for determining the Stern-Volmer constant for a selected first poly(thiophene) and an n-type material. In some cases, the Stern-Volmer constant is at least $10^2$ $M^{-1}$, or at least about $10^3$ $M^{-1}$, or at least about $10^4$ $M^{-1}$, or at least about $10^5$ $M^{-1}$, or at least about $10^6$ $M^{-1}$, or at least about $10^7$ $M^{-1}$, or at least about $10^8$ $M^{-1}$, or at least about $10^9$ $M^{-1}$, or more. As will be known to those of ordinary skill in the art, the magnitude of the Stern-Volmer constant and hence sensitivity can vary as a function of solvent composition.

The first poly(thiophene) and the second poly(thiophene) may be present in a ratio of about 0.05:0.95, or about 0.1:0.9, or about 0.15:0.85, or about 0.2:0.8, or about 0.25:0.75, or about 0.3:0.7, or about 0.4:0.6, or about 0.5:0.5, or more, based on weight. In some cases, the first poly(thiophene) and the second poly(thiophene) are present in a ratio between about 0.01:0.99 and about 0.5:0.5, or between about 0.05:0.95 and about 0.4:0.6, or between about 0.05:0.95 and about 0.25:0.75, or between about 0.10:0.90 and about 0.3:0.7; or between about 0.15:0.85 and about 0.25:0.75.

Those of ordinary skill in the art will be aware of methods and techniques for forming poly(thiophenes) for use in connection with the present invention. For example, see FIG. 2. In some embodiments, a poly(thiophene) may be synthesized under condition such that the thiophene rings are coupled primarily at the 2- and 5-positions of the monomer. The degree of other modes of coupling of these thiophene moieties generally depends on the method of synthesis employed and can afford polymers and/or oligomers of varying regio-regularity may be selectively formed. Regioregular poly(thiophenes) can be synthesized wherein the polymer exhibits nearly 100% of these 2- to 5-couplings. In some cases, the degree of regioregularity of a polymer employed in the invention can be, for example, greater than about 80%, greater than about 85%, greater than about 90%, greater than about 95%, greater than about 96%, greater than about 97%, greater than about 98%, greater than about 99%, greater than about 99.5%, or more.

Those of ordinary skill in the art will be aware of suitable n-type materials for use in connection with the compositions of present invention. Non-limiting examples of n-type materials include fullerenes, inorganic nanoparticles, oxadiazoles, discotic liquid crystals, carbon nanorods, inorganic nanorods, polymers containing moieties capable of accepting electrons or forming stable anions, or combinations thereof. The term "n-type material" is given its ordinary meaning in the art and refers to a material that has more negative carriers (electrons) than positive carriers (holes).

In some embodiments, the n-type material comprises a fullerene, optionally substituted. As used herein, the term "fullerene" is given its ordinary meaning in the art and refers to a substantially spherical molecule generally comprising a fused network of five-membered and/or six-membered aromatic rings. For example, C60 is a fullerene which mimics the shape of a soccer ball. The term fullerene may also include molecules having a shape that is related to a spherical shape, such as an ellipsoid. It should be understood that the fullerene may comprise rings other than six-membered rings. In some embodiments, the fullerene may comprise seven-membered rings, or larger. Fullerenes may include $C_{36}$, $C_{50}$, $C_{60}$, $C_{61}$, $C_{70}$, $C_{76}$, $C_{84}$, and the like. Fullerenes may also comprise individual atoms, ions, and/or nanoparticles in the inner cavity of the fullerene. A non-limiting example of a substituted fullerene which may be used as the n-type material is phenyl-$C_{61}$-butyric acid methyl ester.

In some embodiments, the composition may comprise a ratio of total poly(thiophene) (e.g., both the first poly (thiophene) and the second poly(thiophene), if present):n-type material of between about 0.5:2 to about 2:0.5, or between about 0.5:1.5 and about 1.5:0.5, or between about 0.75:1.25 and about 1.25:0.75, etc., based on weight. In some cases, the ratio of poly(thiophene):n-type material of about 1:5, or about 1:4, or about 1:3, or about 1:2, or about 1:1.5, or about 1:1.25, or about 1:1.15, or about 1:1, or about 1:1.05, or about 1:1, or about 1.05:1, or about 1.1:1, or about 1.25:1, or about 1.5:1, or about 2:1, or about 3:1, or about 4:1, or about 5:1, etc., based on weight.

The compositions of the present invention may find use in a variety of applications. In some embodiments, the composition may be employed in electronic devices, for example photovoltaic cells, light emitting diodes, transistors, batteries, etc.

Photovoltaic cells will be known to those of ordinary skill in the art and generally comprise at least a photoactive composition (e.g., a composition as described herein), and at least two electrode (e.g., an anode and a cathode). The system may optionally comprise at least one substrate (e.g., on which to form the anode and/or cathode), electron-blocking and/or electron-transporting membrane(s), circuitry, power source, and/or electromagnetic radiation source. In some cases, the photoactive composition is positioned between two electrodes. Those of ordinary skill in the art will be aware of appropriate materials to use as the anode and/or cathode. Methods are known in the art to prepare photovoltaic devices. In some cases, the n-type material may be dispersed in clusters throughout the poly(thiophene) material. In some cases, the clusters of n-type material may be substantially surrounded by the first poly(thiophene), as described herein. In some cases, the n-type material and the p-type material can be layered, instead of dispersed within each other. In some cases, an array of different devices with different compositions and different morphologies or different layouts can be used.

In some cases, a photovoltaic cell comprises a film of the composition. Those of ordinary skill in the art will be aware of methods for forming a film of a composition of the present invention, for example, solution coating, ink jet printing, spin coating, dip coating, spray coating, etc. In some embodiments, a solution may be provided comprising the first poly (thiophene), the second poly(thiophene), and the n-type material in a solvent (e.g., tetrahydrofuran, toluene, benzene, diethyl ether, hexanes, dimethylsulfoxide, etc.). One or more, or all of the components to be comprised in the film (e.g., first poly(thiophene), second poly(thiophene, n-type material) may be soluble or substantially soluble in the solvent. The solution may be place on an electrode or substrate, and the solvent may be evaporated, thereby forming a film of a composition of the present invention. The thickness of the film may be between about 1 nm and about 1 mm, or between about 1 nm and about 500 um, or between about 1 nm and about 500 nm, or between about 100 nm and about 500 nm, or between about 100 nm and about 300 nm, etc.

The photovoltaic cells of the present invention may be exposed to light using methods known to those of ordinary skill in the art. The light may interact with the composition of the present invention, causing electrons to be transferred from the poly(thiophene) (e.g., electron-donating material) to the n-type material (e.g., electron-accepting material). The electrons in the n-type material can be transported to the cathode and the corresponding holes can be transported to the anode via the poly(thiophene).

A variety of definitions are now provided which may aid in understanding various aspects of the invention.

In general, the term "aliphatic," as used herein, includes both saturated and unsaturated, straight chain (i.e., unbranched) or branched aliphatic hydrocarbons, which are optionally substituted with one or more functional groups, as defined below. As will be appreciated by one of ordinary skill in the art, "aliphatic" is intended herein to include, but is not limited to, alkyl, alkenyl, alkynyl moieties. Illustrative aliphatic groups thus include, but are not limited to, for example, methyl, ethyl, n-propyl, isopropyl, allyl, n-butyl, sec-butyl, isobutyl, tert-butyl, n-pentyl, sec-pentyl, isopentyl, tert-pentyl, n-hexyl, sec-hexyl, moieties and the like, which again, may bear one or more substituents, as previously defined.

As used herein, the term "alkyl" is given its ordinary meaning in the art and may include saturated aliphatic groups, including straight-chain alkyl groups, branched-chain alkyl groups, cycloalkyl (alicyclic) groups, alkyl substituted cycloalkyl groups, and cycloalkyl substituted alkyl groups. An analogous convention applies to other generic terms such as "alkenyl," "alkynyl," and the like. Furthermore, as used herein, the terms "alkyl," "alkenyl," "alkynyl," and the like encompass both substituted and unsubstituted groups.

In some embodiments, a straight chain or branched chain alkyl may have 30 or fewer carbon atoms in its backbone, and, in some cases, 20 or fewer. In some embodiments, a straight chain or branched chain alkyl has 12 or fewer carbon atoms in its backbone (e.g., $C_1$-$C_{12}$ for straight chain, $C_3$-$C_{12}$ for branched chain), has 6 or fewer, or has 4 or fewer. Likewise, cycloalkyls have from 3-10 carbon atoms in their ring structure or from 5, 6 or 7 carbons in the ring structure. Examples of alkyl groups include, but are not limited to, methyl, ethyl, propyl, isopropyl, cyclopropyl, butyl, isobutyl, tert-butyl, cyclobutyl, hexyl, cyclochexyl, and the like. In some cases, the alkyl group might not be cyclic. Examples of non-cyclic alkyl include, but are not limited to, methyl, ethyl, propyl, isopropyl, n-butyl, tert-butyl, n-pentyl, neopentyl, n-hexyl, n-heptyl, n-octyl, n-decyl, n-undecyl, and dodecyl.

The terms "alkenyl" and "alkynyl" refer to unsaturated aliphatic groups analogous in length and possible substitution to the alkyls described above, but that contain at least one double or triple bond respectively. Alkenyl groups include, but are not limited to, for example, ethenyl, propenyl, butenyl, 1-methyl-2-buten-1-yl, and the like. Non-limiting examples of alkynyl groups include ethynyl, 2-propynyl (propargyl), 1-propynyl, and the like.

The terms "heteroalkenyl" and "heteroalkynyl" refer to unsaturated aliphatic groups analogous in length and possible substitution to the heteroalkyls described above, but that contain at least one double or triple bond respectively.

As used herein, the term "halogen" or "halide" designates —F, —Cl, —Br, or —I.

The term "aryl" refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated Pi electron system, while other, adjoining rings can be cycloalkyls, cycloalkenyls, cycloalkynyls, aryls, and/or heterocycyls. The aryl group may be optionally substituted, as described herein. "Carbocyclic aryl groups" refer to aryl groups wherein the ring atoms on the aromatic ring are carbon atoms. Carbocyclic aryl groups include monocyclic carbocyclic aryl groups and polycyclic or fused compounds (e.g., two or more adjacent ring atoms are common to two adjoining rings) such as naphthyl group. Non-limiting examples of aryl groups include phenyl, naphthyl, tetrahydronaphthyl, indanyl, indenyl and the like.

The terms "heteroaryl" refers to aryl groups comprising at least one heteroatom as a ring atom, such as a heterocycle. Non-limiting examples of heteroaryl groups include pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like.

It will also be appreciated that aryl and heteroaryl moieties, as defined herein, may be attached via an aliphatic, alicyclic, heteroaliphatic, heteroalicyclic, alkyl or heteroalkyl moiety and thus also include -(aliphatic)aryl, -(heteroaliphatic)aryl, -(aliphatic)heteroaryl, -(heteroaliphatic)heteroaryl, -(alkyl) aryl, -(heteroalkyl)aryl, -(heteroalkyl)aryl, and -(heteroalkyl)-heteroaryl moieties. Thus, as used herein, the phrases "aryl or heteroaryl" and "aryl, heteroaryl, (aliphatic) aryl, -(heteroaliphatic)aryl, -(aliphatic)heteroaryl, -(heteroaliphatic)heteroaryl, -(alkyl)aryl, -(heteroalkyl)aryl, -(heteroalkyl)aryl, and -(heteroalkyl)heteroaryl" are interchangeable.

The term "arylalkyl," as used herein, refers to a group comprising an aryl group attached to the parent molecular moiety through an alkyl group.

The term "arylheteroalkyl," as used herein, refers to a group comprising an aryl group attached to the parent molecular moiety through a heteroalkyl group.

The term "heteroarylalkyl," as used herein, refers to a group comprising a heteroaryl group attached to the parent molecular moiety through an alkyl group.

Any of the above groups may be optionally substituted. As used herein, the term "substituted" is contemplated to include all permissible substituents of organic compounds, "permissible" being in the context of the chemical rules of valence known to those of ordinary skill in the art. It will be understood that "substituted" also includes that the substitution results in a stable compound, e.g., which does not spontaneously undergo transformation such as by rearrangement, cyclization, elimination, etc. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl group" must still comprise the phenyl moiety and can not be modified by substitution, in this definition, to become, e.g., a pyridine ring. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms.

Examples of substituents include, but are not limited to, aliphatic, alicyclic, heteroaliphatic, heteroalicyclic, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, heteroalkylthio, heteroarylthio, sulfonyl, sulfonamido, ketone, aldehyde, ester, heterocyclyl, aromatic or heteroaromatic moieties, —$CF_3$, —CN, aryl, aryloxy, perhaloalkoxy, aralkoxy, heteroaryl, heteroaryloxy, heteroarylalkyl, heteroaralkoxy, azido, amino, halide, alkylthio, oxo, acylalkyl, carboxy esters, -carboxamido, acyloxy, aminoalkyl, alkylaminoaryl, alkylaryl, alkylaminoalkyl, alkoxyaryl, arylamino, aralkylamino, alkylsulfonyl, -carboxamidoalkylaryl, -carboxamidoaryl, hydroxyalkyl, haloalkyl, alkylaminoalkylcarboxy-, aminocarboxamidoalkyl-, cyano, alkoxyalkyl, perhaloalkyl, arylalkyloxyalkyl, (e.g., $SO_4(R')_2$), a phosphate (e.g., $PO_4(R')_3$), a silane (e.g., $Si(R')_4$), a urethane (e.g., R'O (CO)NHR'), and the like. Additionally, the substituents may be selected from F, Cl, Br, I, —OH, —$NO_2$, —CN, —NCO, —$CF_3$, —$CH_2CF_3$, —$CHCl_2$, —$CH_2OR_x$, —$CH_2CH_2OR_x$, —$CH_2N(R_x)_2$, —$CH_2SO_2CH_3$, —$C(O)R_x$, —$CO_2(R_x)$, —$CON(R_x)_2$, —$OC(O)R_x$, —$C(O)OC(O)R_x$, —$OCO_2R_x$, —$OCON(R_x)_2$, —$N(R_x)_2$, —$S(O)_2R_x$, —$OCO_2R_x$, —$NR_x(CO)R_x$, —$NR_x(CO)N(R_x)_2$, wherein each occurrence of $R_x$ independently includes, but is not limited to, H, aliphatic, alicyclic, heteroaliphatic, heteroalicyclic, aryl, heteroaryl, alkylaryl, or alkylheteroaryl, wherein any of the aliphatic, alicyclic, heteroaliphatic, heteroalicyclic, alkylaryl, or alkylheteroaryl substituents described above and herein may be substituted or unsubstituted, branched or unbranched, cyclic or acyclic, and wherein any of the aryl or heteroaryl substituents described above and herein may be substituted or unsubstituted.

The following examples are intended to illustrate certain embodiments of the present invention, but do not exemplify the full scope of the invention.

Example 1

In this example, several hexafluoroisopropanol (HFIP)-containing polythiophenes, and the utilization of the polymers to study the effect of hydrogen bonding on charge transfer processes and morphological phenomena. The fluorescence quenching interactions between these polymers and PCBM indicated that the hydrogen bonding may facilitate the charge transfer processes from the polymers to PCBM. The XRD data of the polymers and their mixtures with PCBM demonstrated that the HFIP substitution can prevent clean phase separation between the polythiophene and the PCBM.

Synthesis of Monomers

Figure 4:
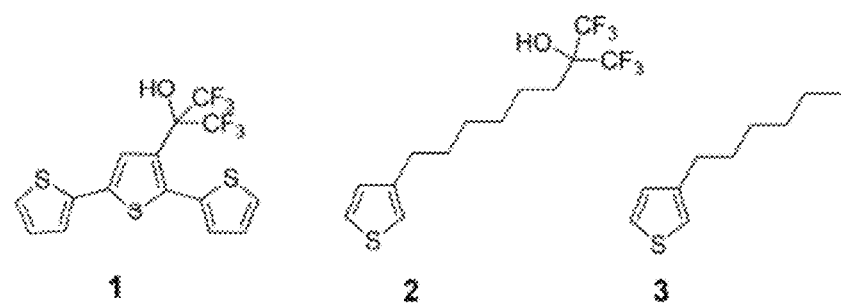
FIG. 4 shows structures of monomers 1, 2, 3.

The polymers studied in this non-limiting example are HFIP-functionalized polythiophenes. The HFIP group can have strong hydrogen bond acidity and may interact strongly with PCBM. FIG. 4 shows the structures of the monomers explored in this example. In monomer 1, the HFIP group was directly connected to the thiophene, while in monomer 2 the HFIP group was connected to the thiophene via a C6 chain. In part, to achieve high solubility of the polymers in organic solvents, copolymers with 3-hexylthiophene 3 were made.

Figure 5:
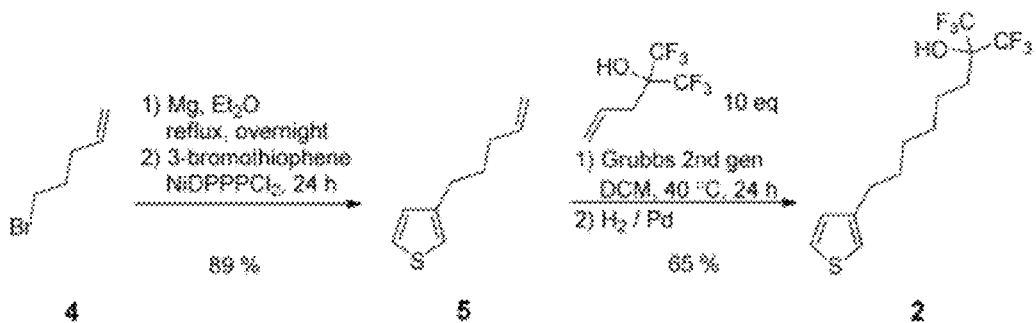
FIG. 5 shows a schematic of the synthesis of monomer 2.

The synthesis of monomer 2 is summarized in FIG. 5. 5-bromo-1-pentene 4 readily reacted with magnesium to yield corresponding Grignard compound. The intermediate then underwent nickel catalyzed Grignard coupling with 3-bromothiophene in the presence of 0.1 mol % [1,3-bis(diphenylphosphino)propane]Ni(II) chloride (NiD2Cl$_2$) as catalyst in refluxing ether, leading to the 3-(4-pentenyl)thiophene 5. Olefin cross-metathesis between precursor 5 and a HFIP substituted terminal olefin with Grubbs' second generation ruthenium catalyst, and subsequent reduction with H$_2$/Pd proceeded to give monomer 2, with a pendant HFIP group, in good yield (65%). The synthesis of monomer 1 will be known to those of ordinary skill in the art and monomer 3 is commercially available.

Synthesis of Polymers

Figure 6:
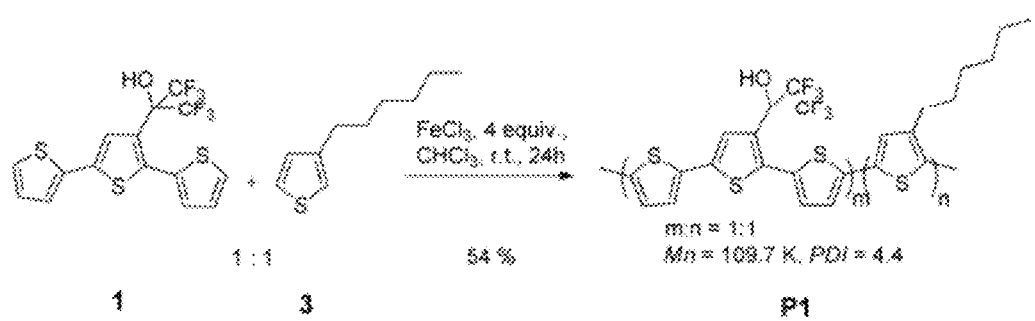
FIG. 6 shows a schematic of the synthesis of polymer P1.
Figure 7:
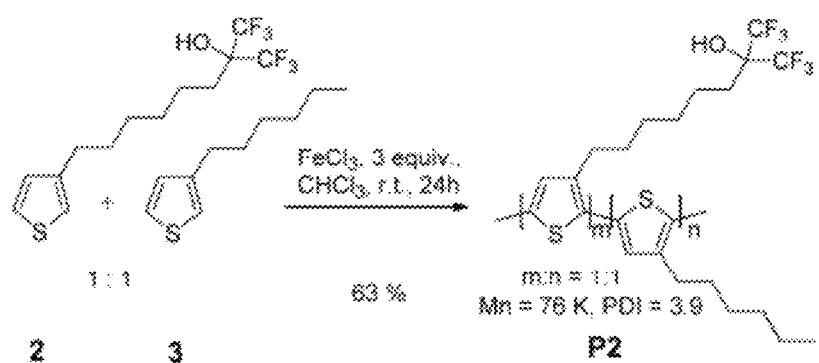
FIG. 7 shows a schematic of the synthesis of polymer P2.

The synthesis of copolymer P1 is summarized in FIG. 6. Anhydrous chloroform was employed and 4 equivalents of the iron chloride catalyst to maintain maximum catalytic activity during the polymer synthesis. In order to achieve high molecular weights, the polymer was fractionated by sequentially precipitating it in solvent mixtures containing increasing amounts of a compatible or 'good' solvent (e.g., hexane, hexane/ethyl acetate (16:1) and hexane/ethyl acetate (6:1)). In this way, a random co-polymer of HFIP monomer 1 and 3-hexylthiophene monomer 3 of number average molecular weights as high as 109,700 was produced. Using a similar method, a random co-polymer of HFIP monomer 2 and 3-hexylthiophene monomer 3 was synthesized to study, in part, the effect of the position of the HFIP group (FIG. 7). In this case, polymers with a number average molecular weight of 76,000 were produced.

Photophysical Characterization

Figure 8:
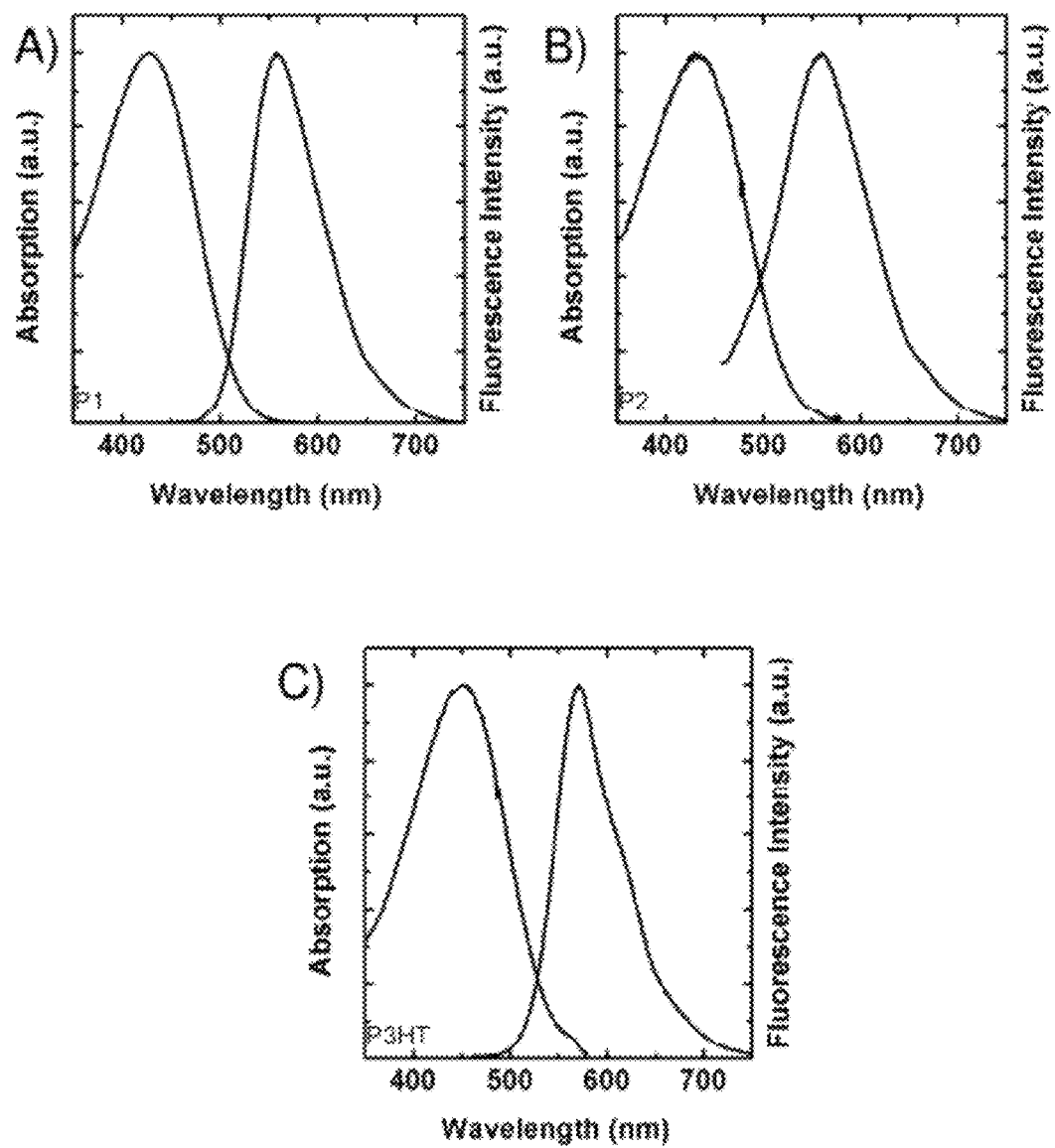
FIG. 8 shows the absorption and fluorescence spectra of A) P1, B) P2, and C) P3HT.

The photophysical properties of P1 and P2 were characterized and the results are summarized in FIG. 8 and Table 1. The data of P3HT are also listed for comparison. From the data, the presence of the functionalized HFIP groups resulted in essentially no significant perturbation to the photophysical properties of the polythiophenes, including the shape of the absorption and emission spectra, extinction coefficients, quantum yields, and fluorescence lifetimes. However, absorption and emission maxima of polymers P1 and P2 was blue shifted as compared to P3HT. This effect may be attributed to, for example, the electron-withdrawing properties of the HFIP functional group that may increase the band gap of the conjugated system. Alternatively or in addition, the molecular weights of P1 and P2 are significantly larger than that of P3HT and the blue shift may be also attributed to the regio-random structures of P1 and P2 that may cause a minor twist to the conjugated back bones of polythiophenes.

Figure 9:
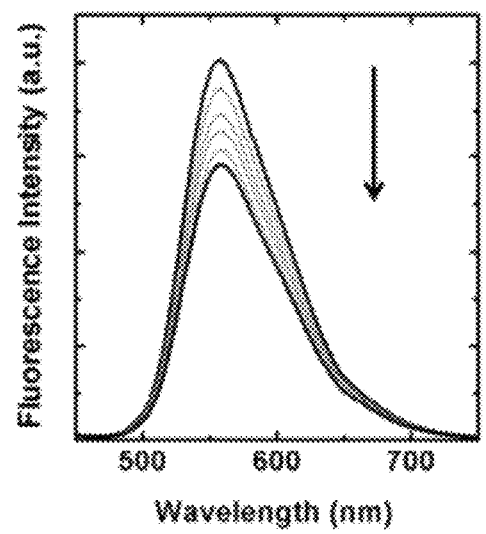
FIG. 9 shows the fluorescence of a P1 solution quenched by PCBM.

Solution Fluorescence Quenching Studies:

The fluorescence quenching of the polymers in dilute solution to understand the interaction between the functionalized polythiophenes and PCBM on a molecular level was explored. Anhydrous toluene was used as the solvent, and was bubbled with argon for 30 min before use. The fluorescence quenching properties were investigated by measuring the fluorescence intensity changes of the polymer solutions with the addition of PCBM. PCBM was dissolved in a polymer solution with the same concentration as the initial solution, so that the polymer concentration remained constant throughout the experiment. FIG. 9 shows typical fluorescence spectra of P1 with the addition of increasing amount of PCBM. The concentration of PCBM ranged from 0 to $7.7 \times 10^{-5}$ (top to bottom). Similar data were obtained for P2 and P3HT. No new emission bands were observed with these three polymers during the quenching studies.

Figure 10:
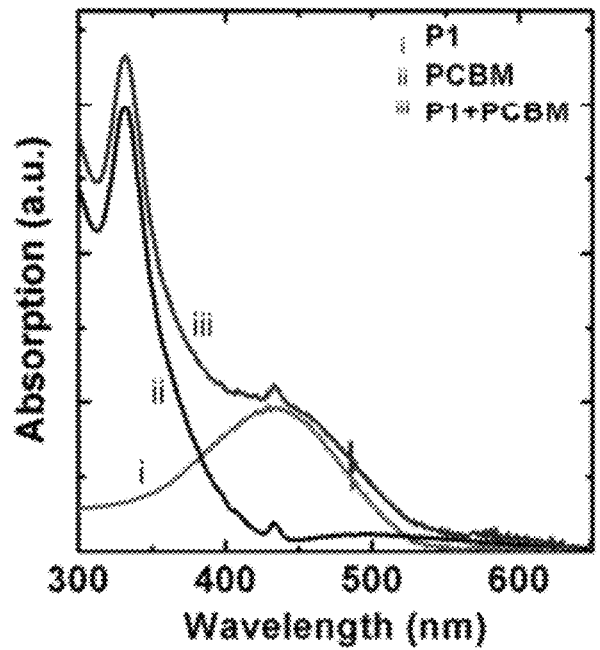
FIG. 10 shows absorption spectra of toluene solutions of (i) P1 ($1.2 \times 10^{-5}$M), (ii) PCBM ($1.7 \times 10^{-5}$M) and (iii) P1 ($1.2 \times 10^{-5}$M)/PCBM ($1.7 \times 10^{-5}$M) mixture.

Representative UV-Vis absorption spectra of the polymer P1, PCBM and the mixed solution are shown in FIG. 10, (i) P1, $1.2 \times 10^{-5}$M, (ii) PCBM, $1.7 \times 10^{-5}$M, (iii) P1, $1.2 \times 10^{-5}$M/PCBM, $1.7 \times 10^{-5}$M mixture. There is a competitive absorption of PCBM at the excitation and emission wavelengths of P1. To account for this effect, the measured fluorescence was corrected by equation (1).

$$F = F_{em} \times \frac{1 - e^{-\varepsilon_1 C_1 l}}{\varepsilon_1 C_1 l} \times \frac{\varepsilon_1 C_1 l + \varepsilon_2 C_2 l}{1 - e^{-(\varepsilon_1 C_1 + \varepsilon_2 C_2)}} \times \frac{\varepsilon_3 C_2 l}{1 - e^{-\varepsilon_3 C_2 l}} \quad (1)$$

In this equation, $F_{em}$ denotes the experimental fluorescence intensity, F demotes the corrected fluorescence intensity, $C_1$ is the molar concentration of polythiophene, $C_2$ is the molar concentrations of PCBM, $\varepsilon_1$ is the molar extinction coefficient of a polythiophene at its excitation wavelength (451 nm for P3HT), $\varepsilon_2$ is the molar extinction coefficient of PCBM at the excitation wavelength of the polymer (451 nm for P3HT), $\varepsilon_3$ is the molar extinction coefficient of PCBM at the emission maxima of the polymer (471 nm for P3HT), and l is the thickness of the cell.

Figure 11:
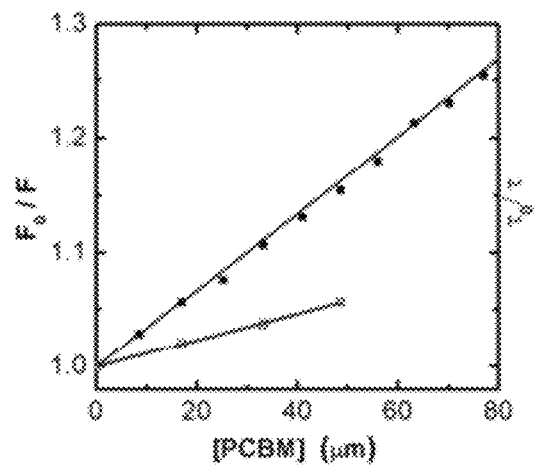
FIG. 11 shows Stern-Volmer plots of P1 in anhydrous toluene in response to PCBM.

FIG. 11 shows the relative changes of the corrected fluorescence intensities of P1 as a function of PCBM concentration. The change in the lifetime of P1 is shown in hollow squares. Both the relative fluorescence intensity change and the lifetime changes have a linear relationship with the PCBM concentration. The fact that the fluorescence intensity and lifetime have different slopes may indicate that the quenching process is a combined process of dynamic quenching and static quenching. Since dynamic quenching can be attributed to diffusive collisions between the photoluminescence emitter and the quencher, the lifetime may change in the same fashion as the fluorescence intensity. In contrast, since static

TABLE 1

Photophysical Data of Polymers P1, P2 and P3HT.[a]

| Polymers | $M_n$ (PDI) | Absorption maxima (nm) | Emission maxima (nm) | Extinction coefficients[b] ($10^3$ M$^{-1}$ cm$^{-1}$) | Quantum yield[c] | Lifetime (ns) |
|---|---|---|---|---|---|---|
| P1 | 109 (4.4) | 430 | 558 | 5.4 | 31% | 0.60 |
| P2 | 76 (3.9) | 434 | 558 | 5.2 | 35% | 0.58 |
| P3HT | 24 (1.5) | 451 | 571 | 5.3 | 33% | 0.66 |

[a] The absorption and emission spectra, extinction coefficients, quantum yields and lifetimes were all measured in anhydrous toluene solution.
[b] Extinction coefficients were calculated based on each thiophene ring on the polymer backbone as a monomer.
[c] Fluorescence quantum yields were achieved by comparison with fluorescein in 0.1N NaOH as a standard.

quenching can occur through the formation of a ground state complex, the lifetime of the polymer may not be affected. In FIG. 11, $F_0/F$ (solid square), $\tau_0/\tau$ (red hollow square), fitting of experimental data to equations (3) and (4) with $K_D$ and $Ks$ determined to be $1.2\times10^3 M^{-1}$ and $2.2\times10^3 M^{-1}$, respectively.

The quenching effect may be quantitatively described by Stern-Volmer equation (2).

$$\frac{F_0}{F} = (1 + K_D[Q])(1 + K_S[Q]) \quad (2)$$

In this equation, $F_0$ and $F$ are the fluorescence intensities in the absence and presence of quencher Q, respectively. $K_D$ is the dynamic quenching constant, $K_S$ is the static quenching constant and [Q] is the quencher concentration. At low quencher concentrations, equation (2) can be simplified into a linear equation (3).

$$\frac{F_0}{F} = 1 + (K_D + K_S)[Q] \quad (3)$$

The value for $(K_D+K_S)$ can be obtained as the slope of the Stern-Volmer plot, while the dynamic quenching constant $K_D$ can be determined by lifetime measurements:

$$\frac{\tau_0}{\tau} = K_D[Q] \quad (4)$$

where $\tau_0$ and $\tau$ are the lifetime of polymers in the absence and presence of quencher Q, respectively.

By fitting the quenching data of P1 with equations (3) and (4), $K_D$ and $Ks$ were determined to be $1.2\times10^3 M^{-1}$ and $2.2\times 10^3 M^{-1}$, respectively. Large dynamic quenching constants have also been observed with a poly(phenylvinylene) quenched by PCBM, and can be explained, at least in part, based on the efficient exciton diffusion that occurs in conjugated polymers. Given the hydrogen bonding acidity of the HFIP group, the large value of static quenching constant may be attributed to the closely associated hydrogen bond complex between the HFIP functionalized P1 and the PCBM. The enhancement of fluorescence quenching, induced by specific chemical bindings, has been conceptualized as a "molecular wire" effect, which finds widespread applications in fluorescence based chemical sensing.

Figure 12:
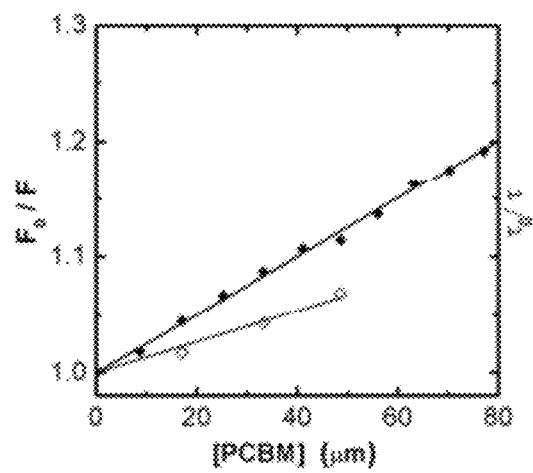
FIG. 12 shows Stern-Volmer plots of P1 in anhydrous toluene comprising 1% tetrahydrofuran in response to PCBM.

Interestingly, the same quenching experiment of P1 was repeated using 1% tetrahydrofuran in anhydrous toluene as a solvent, and remarkably different results were obtained (FIG. 12). A comparable $K_D$ value ($1.3\times10^3 M^{-1}$) but a largely decreased $Ks$ value ($1.2\times10^3 M^{-1}$) was observed. The decrease in static quenching constant may be attributed to the fact that tetrahydrofuran, a very strong hydrogen bond acceptor, binds strongly with the HFIP group and hinders the formation of a complex between HFIP and PCBM. In FIG. 12 $F_0/F$ (solid diamond), $\tau_0/\tau$ (red hollow diamond), fitting of experimental data to equations (3) and (4) with $K_D$ and $Ks$ determined to be $1.3\times10^3 M^{-1}$ and $1.2\times10^3 M^{-1}$, respectively.

Figure 13:
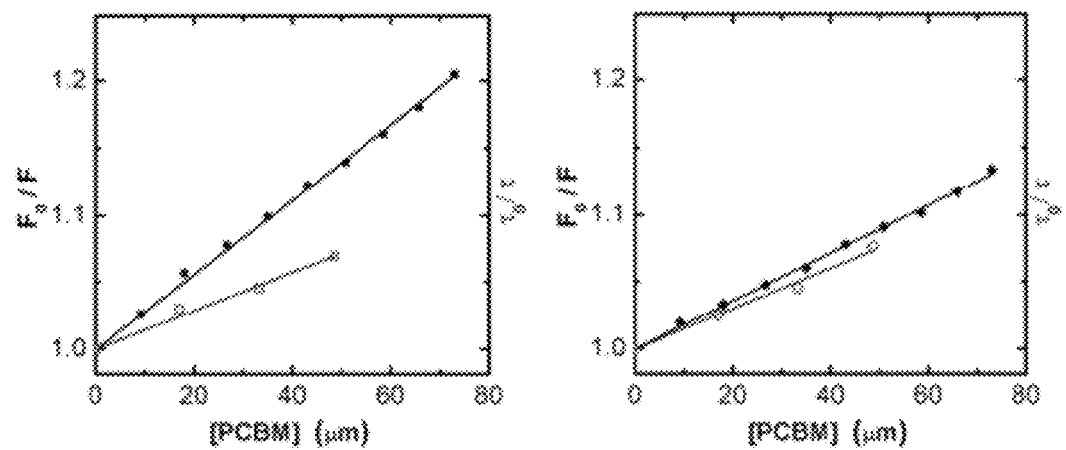
FIG. 13 shows Stern-Volmer plots of P2 in anhydrous toluene (left) and in 1% tetrahydrofuran/toluene (right) in response to PCBM.
Figure 14:
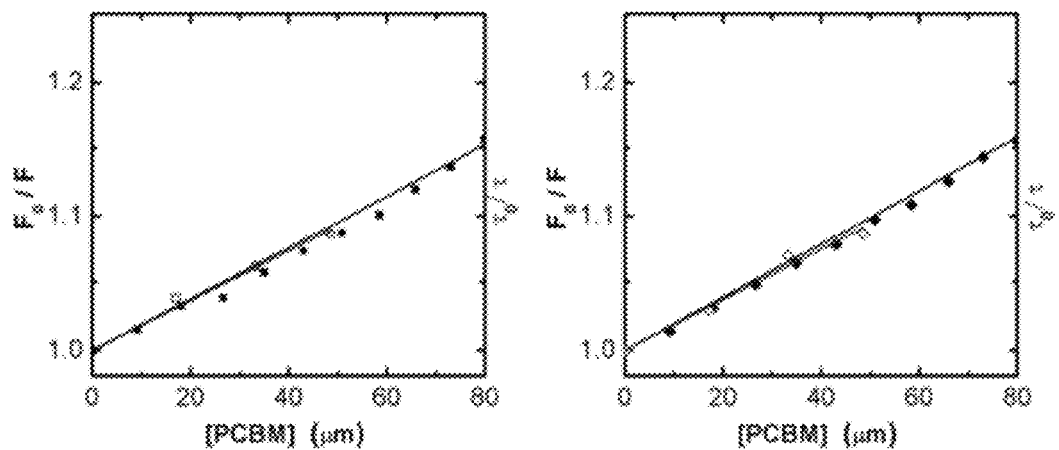
FIG. 14 shows Stern-Volmer plots of P3HT in anhydrous toluene (left) and in 1% tetrahydrofuran/toluene (right) in response to PCBM.

Quenching experiments with P2 and P3HT were performed both in anhydrous toluene and in 1% tetrahydrofuran/toluene solvents, and the results are summarized in FIGS. 13-14 and Table 2. Similar to P1, the presence of tetrahydrofuran decreased the static quenching constant of P2, but did not influence the quenching behavior of the P3HT-PCBM system. The fact that P3HT experiments yielded almost the same slope for fluorescence changes and lifetime changes indicates that the quenching of P3HT may be dynamic in nature. FIG. 13 shows Stern-Volmer plots of P2 in anhydrous toluene (left) and in 1% tetrahydrofuran/toluene (right) in response to PCBM. In FIG. 13, $F_0/F$ (solid squares), $\tau_0/\tau$ (hollow squares labels). FIG. 14 shows Stern-Volmer plots of P3HT in anhydrous toluene (left) and in 1% tetrahydrofuran/toluene (right) in response to PCBM ($F_0/F$=solid squares, $\tau_0/\tau$=hollow squares).

TABLE 2

Quenching Constant Data of polymers P1, P2 and P3HT.[a]

| | In Anhydrous Toluene | | | In 1% Tetrahydrofuran/Toluene | | |
|---|---|---|---|---|---|---|
| Polymers | $K_S+K_D$ ($10^3 M^{-1}$) | $K_S$ ($10^3 M^{-1}$) | $K_D$ ($10^3 M^{-1}$) | $K_S+K_D$ ($10^3 M^{-1}$) | $K_S$ ($10^3 M^{-1}$) | $K_D$ ($10^3 M^{-1}$) |
| P1 | 3.4 | 2.2 | 1.2 | 2.4 | 0.9 | 1.5 |
| P2 | 2.8 | 1.4 | 1.4 | 1.8 | 0.3 | 1.5 |
| P3HT | 1.9 | 0 | 1.9 | 1.9 | 0 | 1.9 |

[a]All dynamic quenching constants were determined by fitting the experimental data of the lifetime changes to equation (4). All static quenching constants were determined by fitting the experimental data of the fluorescence intensity changes to equation (3) and by subtracting the dynamic quenching constants.

As shown in Table 2, the HFIP functionalized polythiophenes generally have smaller dynamic quenching constants than P3HT. Considering the electron-withdrawing properties of the HFIP group, it is likely that the energy levels of the HFIP-containing polymers are less favorable for charge-transfer to the PCBM than that of P3HT. Another possible reason, especially in the case of P2 where the HFIP is not directly connected to the conjugated backbone, is that the bulky HFIP group may hinder the collisions of PCBM with the polythiophene backbone. However, these HFIP-polymers still have larger total quenching constants than P3HT in anhydrous toluene due to the contribution of hydrogen bonding-induced static quenching.

Crystallinity of the Polymers

Figure 15:
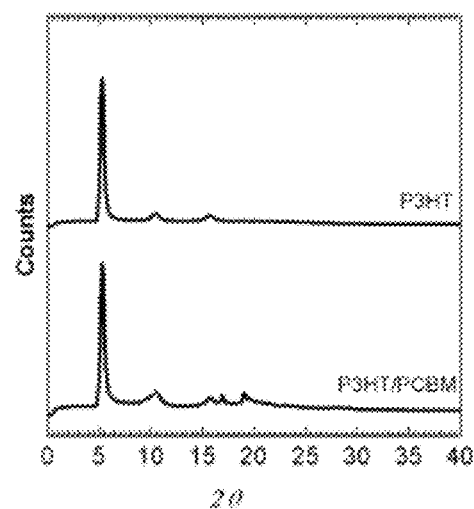
FIG. 15 shows the XRD patterns of P3HT in pure form and with PCBM (1:1 by weight).

The crystallinity of the polymers was investigated by X-ray Diffraction (XRD). FIG. 15 shows the XRD data of P3HT after annealing in vacuum at 140° C. for 1 hour. A typical lamellar structure ($d_{layer}$=16.3 Å) is observed with these samples. The two new sharp peaks that appeared at 16 and 20° (2θ) in the polymer/PCBM mixtures are assigned to the PCBM phase. FIG. 15 shows the XRD patterns of P3HT in pure form and with PCBM (1:1 by weight), after annealing in vacuum at 140° C. for 1 hour.

Figure 16:
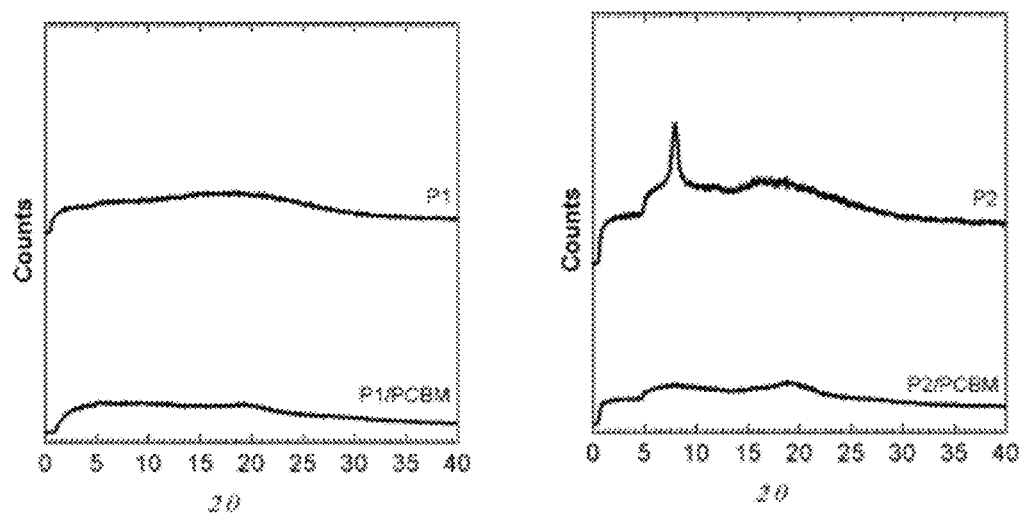
FIG. 16 shows the XRD patterns of P1 and P2 in pure form and with PCBM (1:1 by weight).

As shown in FIG. 16, P1 and P2 have less ordered structures than region-regular P3HT. FIG. 16 shows the XRD patterns of P1 and P2 in pure form and with PCBM (1:1 by weight), after annealing in vacuum at 140° C. for 1 hour. The direct functionalization of the HFIP on the polythiophene backbone creates an amorphous material of P1. P2, with pendant HFIP groups, has an ordered structure with a sharp peak at d=11.0 Å. This peak can be explained by a layered structure with interpenetrating chains. However, this order is mostly lost in the 1:1 composition with PCBM. This suggests that the binding of the HFIP group can lead to a homogenous dispersion of the polymer and PCBM. The interaction of the HFIP group with PCBM may prevent phase separation.

Several HFIP-containing polythiophenes have been designed and synthesized. Their photophysical properties and the fluorescence quenching phenomena have been systematically investigated. An interesting enhancement of the energy transfer constants was observed with these polymers, and was demonstrated to result from the strong hydrogen bonding between the HFIP group and PCBM. The XRD data of the polymers and their mixtures with PCBM demonstrated that the HFIP substitution prevents clean phase separation between the polythiophene and the PCBM. These results together show that molecular interactions may change the donor-acceptor interactions and may control the polymer morphology.

Materials. All chemicals were of reagent grade from Sigma-Aldrich, Alfa Aesar, or Acros and used as received. All solvents were of spectroscopic grade unless otherwise noted. Anhydrous tetrahydrofuran and toluene were obtained from J. T. Baker and purified by passing through a Glasscontour dry solvent system.

General Methods and Instrumentation.

All synthetic manipulations were carried out under an argon atmosphere using standard Schlenk techniques unless otherwise noted. Glassware was oven-baked and cooled under $N_2$ atmosphere. $^1H$ NMR spectra were recorded on a Varian Mercury-300 MHz or a Varian Unity-500 MHz instrument. Polymer molecular weights were determined by gel permeation chromatography using an HP series 1100 GPC system running at a flow rate at 1.0 mL/min in THF and a diode detector. The molecular weights are reported relative the polystyrene standards purchased from Polysciences. UV-vis spectra were recorded with an Agilent 8453 diode-array or Cary 50 UV-vis spectrophotometer, corrected for baseline with a solvent-filled cuvette. Emission spectra were acquired on a SPEX Fluorolog-τ3 fluorometer. The spectra in solution were obtained at room temperature using a quartz cuvette with a path length of 1 cm at right angle detection. The absorbance of all samples used for fluorescence studies were equal to or below 0.1. Lifetime experiments were performed using a SPEX MF$^2$ Multi-Frequency Fluorometer equipped with a 365 nm LED. Time decay of fluorescence was determined by a phase-modulation method, using frequencies between 10 and 250 MHz. Lifetimes were calculated relative to POPOP in ethanol, which has a lifetime of 1.35 ns. X-ray data were collected using an Inel CPS 120 position sensitive detector using an XRG 3000 generator (Cu Kα)

Synthesis of Compound 5.

Into a 25 mL three-neck flask was added magnesium turnings (0.79 g, 33 mmol) followed by sequentially vacuuming and refilling with argon for three times. 3 mL ether was then added to the flask via syringe. 4-pentenyl bromide 4 in 10 mL ether was then added dropwisely to the reaction mixture with an addition funnel. After refluxing overnight, the reaction mixture was then transferred via cannula to a second addition funnel, and added dropwisely to a mixture of NiD2Cl$_2$ (15 mg, 0.1 mol %) and 3-bromothiophene (2.3 mL, 25 mmol) in 10 mL ether under argon at 0° C. over 1 h. After refluxing for 24 h, the reaction mixture was cooled down to room temperature and was hydrolyzed by 10 mL 1 N HCl and 30 mL ice water. The mixture was then extracted with ether for 3 times. The combined organic phases was then washed to neutrality, and dried over MgSO$_4$. After removal of the solvent, the crude product was purified by column chromatography (hexane) to yield 3.4 g (89%) of a colorless liquid. $^1H$ NMR (300 MHz, CD$_2$Cl$_2$): δ 7.26 (dd, 1H, J=3, 5), 6.97 (d, 1H, J=5), 6.96 (d, 1H, J=3), 5.85 (m, 1H), 5.06 (m, 1H), 5.00 (m, 1H), 2.65 (t, 2H, J=7), 2.11 (m, 2H), 1.72 (m, 2H).

Synthesis of Compound 2.

Into a 25 mL Schlenk flask was added compound 5 (0.38 g, 2.5 mmol) and 0.01 g (0.01 mmol) of Grubbs' second generation ruthenium catalyst followed by sequentially vacuuming and refilling with argon for three times. A solution of 1,1,1-trifluoro-2-(trifluoromethyl)-pent-4-en-2-ol (5 g, 24 mmol) in 5 mL dichloromethane was added to the flask via syringe. The reaction mixture was heated to 40° C. for 24 h. After cooling to room temperature, the solvent was removed and the crude product was separated with column chromatography (hexane:dichloromethane=2:1). The compound with RF of 0.3 was collected. Removal of the solvent yielded 0.62 g of a colorless liquid. The liquid was dissolved in ethanol and then subjected hydrogenation with Pd as catalyst (0.1 g of 10% Pd on carbon) at 40 PSI overnight. The reaction mixture was filtered through of a pad of celite. After removal of the solvent, the crude product was purified with column chromatography (hexane:dichloromethane=2:1) and yielded 0.54 g (65%) of a colorless liquid. $^1H$ NMR (300 MHz, CD$_2$Cl$_2$): δ 7.25 (dd, 1H, J=3, 5), 6.96 (d, 1H, J=5), 6.94 (d, 1H, J=3), 2.99 (s, 1H), 2.63 (t, 2H, J=7), 1.94 (t, 2H, J=8), 1.62 (m, 2H), 1.42-1.26 (m, 2H). $^{19}F$ NMR (282 MHz, CD$_2$Cl$_2$): δ −77.32.

Synthesis of Polymer P1.

To a 25 mL round-bottom flask with anhydrous iron trichloride (0.13 g, 0.8 mmol) in chloroform (15 mL) was added monomer 1 (41 mg, 0.1 mmol) and monomer 3 (17 mg, 0.1 mmol) in a chloroform solution (1 mL). The mixture was sonicated for 2 h, and then stirred at room temperature for 24 h. It was then diluted with tetrahydrofuran (100 mL), reduced with sodium thiosulphate (0.5 g), then washed sequentially with water (100 mL), 0.1 M hydrazine aqueous solution (100 mL), water (100 mL), brine (100 mL), dried over MgSO4, filtered with a 0.2 μm FIFE filter and evaporated to 10 mL under reduced pressure. The polymer solution was then precipitated into 60 mL of hexane. The precipitate was isolated by centrifugation and decantation of the liquid. The precipitate was dissolved in tetrahydrofuran (10 mL) and precipitated into hexane/ethyl acetate (16:1, 60 mL in total). The precipitate was isolated by centrifugation and decantation of the liquid. The precipitate was dissolved in tetrahydrofuran (10 mL) and precipitated into hexane/ethyl acetate (6:1, 60 mL in total). The material was dried under vacuum to yield an dark-red solid (31 mg, 54%). According to gel-permeation chromatography (with tetrahydrofuran as eluent and with polystyrene standards), polymer P1 has a number average molecular weight (Mn)=109.7 K and a polydispersity index (PDI)=4.4. $^1H$ NMR (300 MHz, THF) δ: 7.69 (1H), 7.34 (2H), 7.25 (2H), 7.20 (1H), 7.09 (1H), 2.85 (2H), 1.77 (2H), 1.47 (2H), 1.35 (2H), 0.92 (3H). $^{19}F$ NMR (282 MHz, THF) δ: −76.36.

Synthesis of Polymer P2.

To a 50 mL round-bottom flask with anhydrous iron trichloride (0.19 g, 1.2 mmol) in chloroform (20 mL) was added monomer 2 (67 mg, 0.2 mmol) and monomer 3 (34 mg, 0.2 mmol) in a chloroform solution (2 mL). The mixture was sonicated for 2 h, and then stirred at room temperature for 24 h. It was then diluted with tetrahydrofuran (100 mL), reduced with sodium thiosulphate (0.5 g), then washed sequentially with water (100 mL), 0.1 M hydrazine aqueous solution (100 mL), water (100 mL), brine (100 mL), dried over MgSO4, filtered with a 0.2 µm PTFE filter and evaporated to 10 mL under reduced pressure. The polymer solution was then precipitated into 60 mL of hexane. The precipitate was isolated by centrifugation and decantation of the liquid. The precipitate was dissolved in tetrahydrofuran (10 mL) and precipitated into hexane/ethyl acetate (16:1, 60 mL in total). The precipitate was isolated by centrifugation and decantation of the liquid. The precipitate was dissolved in tetrahydrofuran (10 mL) and precipitated into hexane/ethyl acetate (6:1, 60 mL in total). The material was dried under vacuum to yield a black solid (65 mg, 63%). According to gel-permeation chromatography (with tetrahydrofuran as eluent and with polystyrene standards), polymer P2 has a Mn=76 K and a PDI=3.9. $^1$H NMR (300 MHz, THF) δ: 6.99 (2H), 2.97-2.42 (4H), 1.93 (2H), 1.80-1.62 (4H), 1.62-1.07 (13H), 0.91 (3H). $^{19}$F NMR (282 MHz, CDCl$_3$) δ: −77.04.

Example 2

FIGS. 2A-2H show synthetic routes to monomers and polymers of the present invention.

Figure 17:
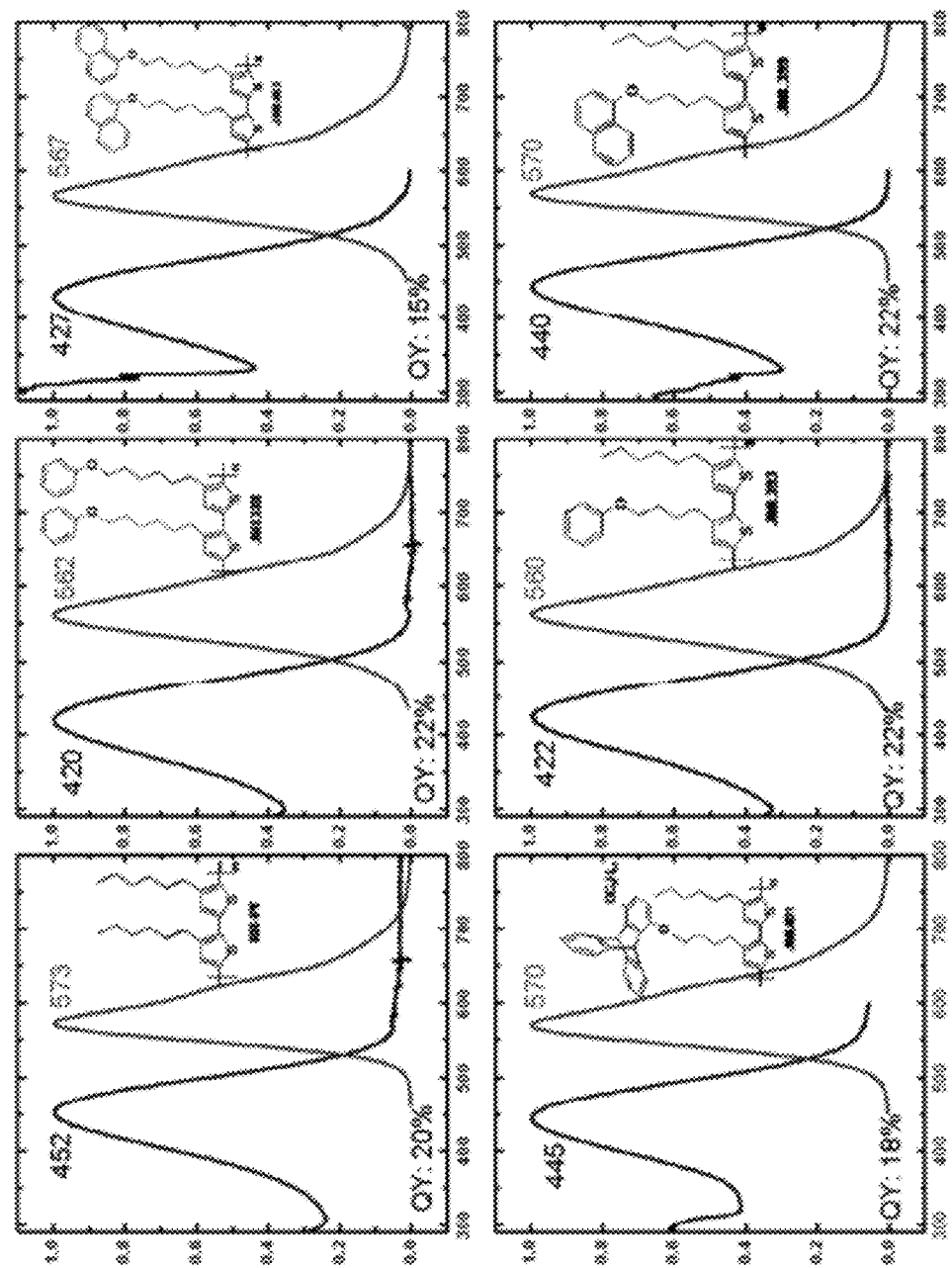
FIG. 17 shows absorption/fluorescence spectra of some polymers used in connection with the compositions of the present invention.

FIG. 17 shows absorption/fluorescence spectra of some polymers used in connection with the compositions of the present invention. As shown in FIG. 17, the inclusion of functional groups on the side chains of a poly(thiophene) may not affect the optical properties of the poly(thiophene). In some cases, this is useful as it is desirable to maintain the electronic/optical properties of the conjugated polymer backbone as unchanged as possible, so that the conducting and light absorption capabilities of the polymer are not disturbed.

Figure 18:
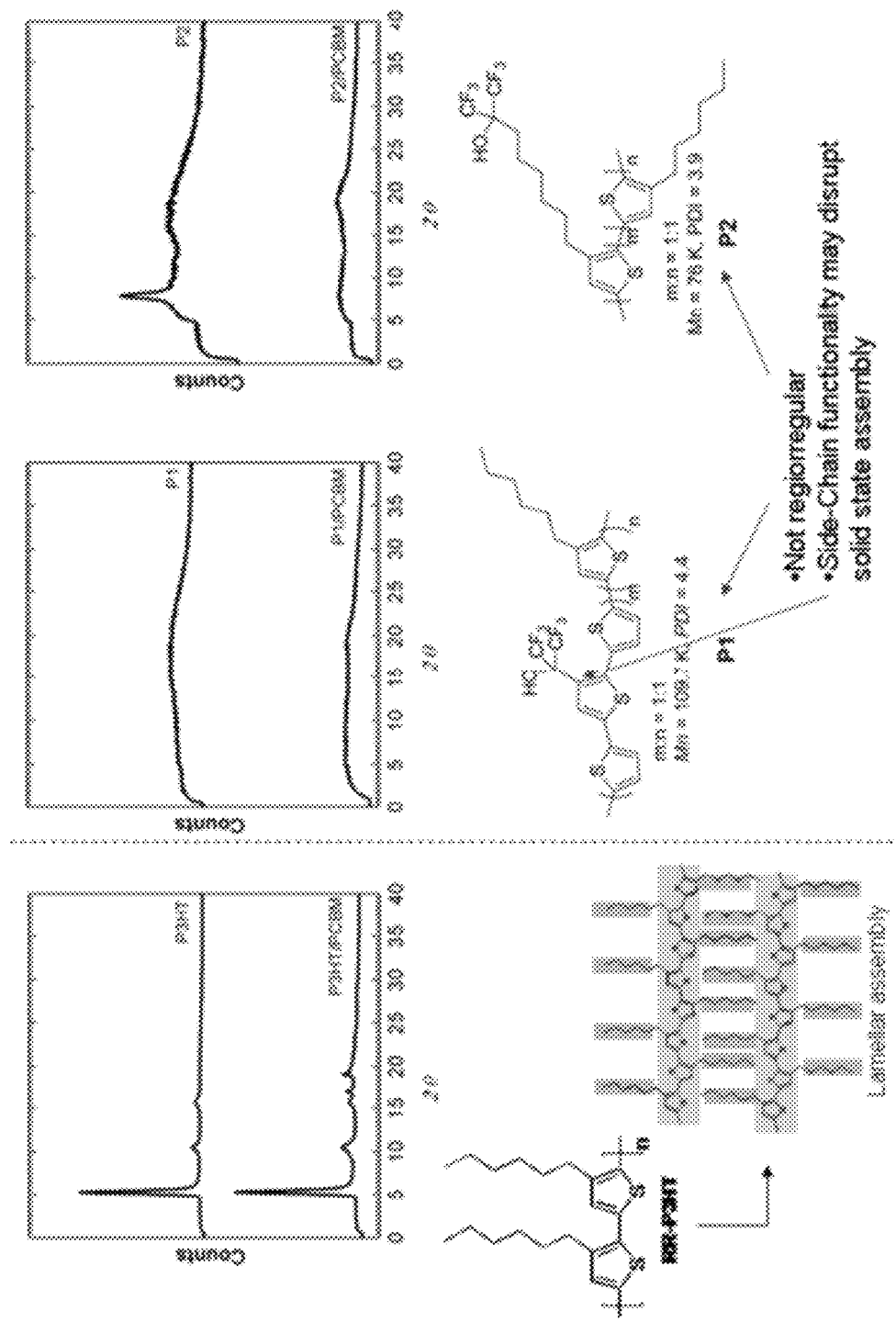
FIG. 18 shows powder XRDs of some materials of the present invention, as well as poly(3-hexyl thiophene) (P3HT).

FIG. 18 shows powder XRDs of some materials of the present invention, as well as poly(3-hexyl thiophene) (P3HT). In this figure, the XRD for P3HT (3 peaks corresponding to a lamellar structure), and the XRD for a P3HT/PCBM 1:1 mixture is shown (left). In some cases, the addition of a second poly(thiophene) may disrupt the order of the P3HT polymer, for example, as shown in this figure (middle, right).

Figure 19:
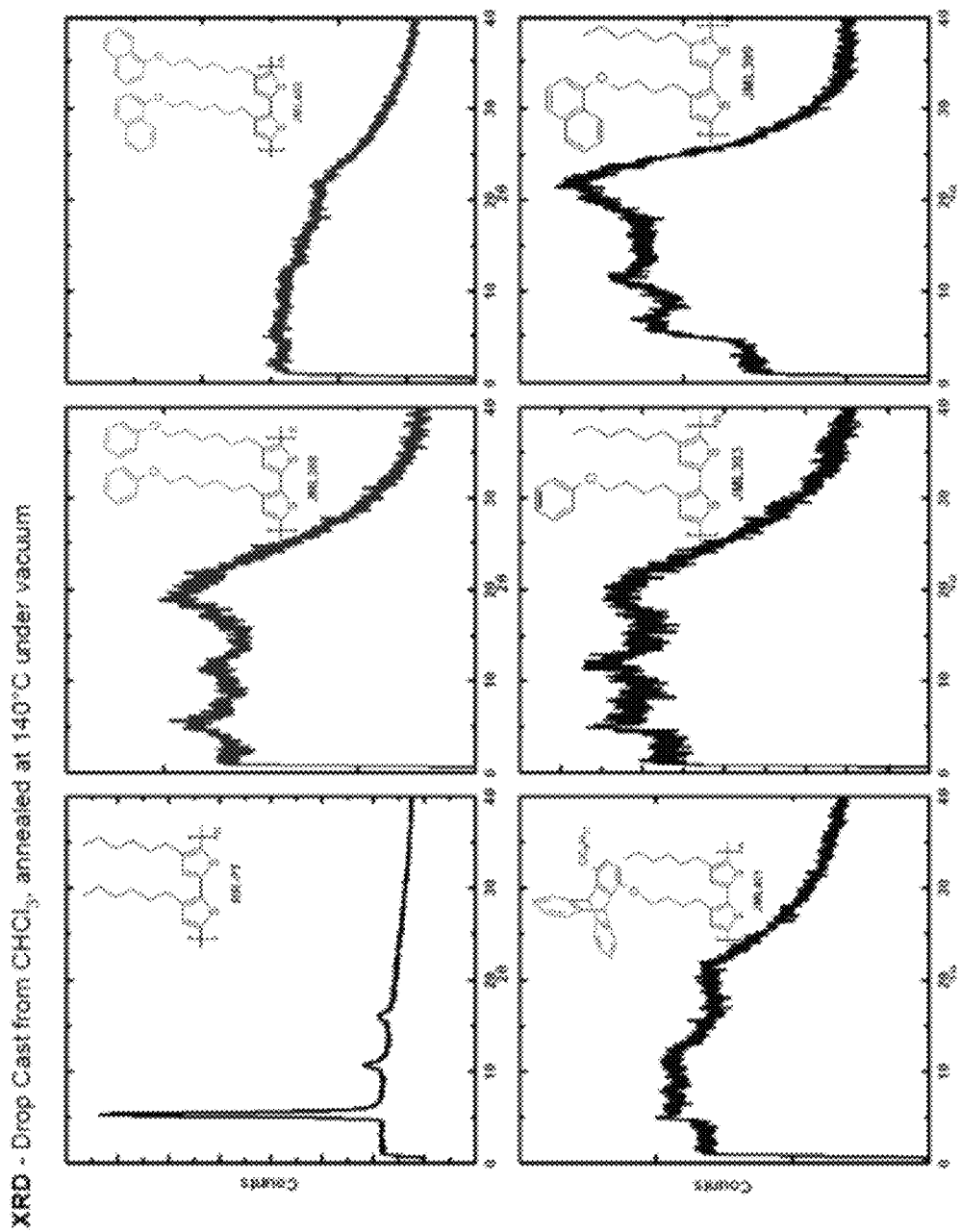
FIG. 19 shows XRD spectra of polymers for use with compositions of the present invention.

FIG. 19 shows XRD spectra of polymers for use with compositions of the present invention (e.g., as depicted). Three peaks are observed, indicating lamellar packing. The broadening of the peaks may be attributed to, at least in part, the bulkier side chains of the first poly(thiophene) materials. In some cases, an alternating AB regioregular polymer can better maintain the ordering, for example, as shown by the upper and lower far right spectra.

Figure 20:
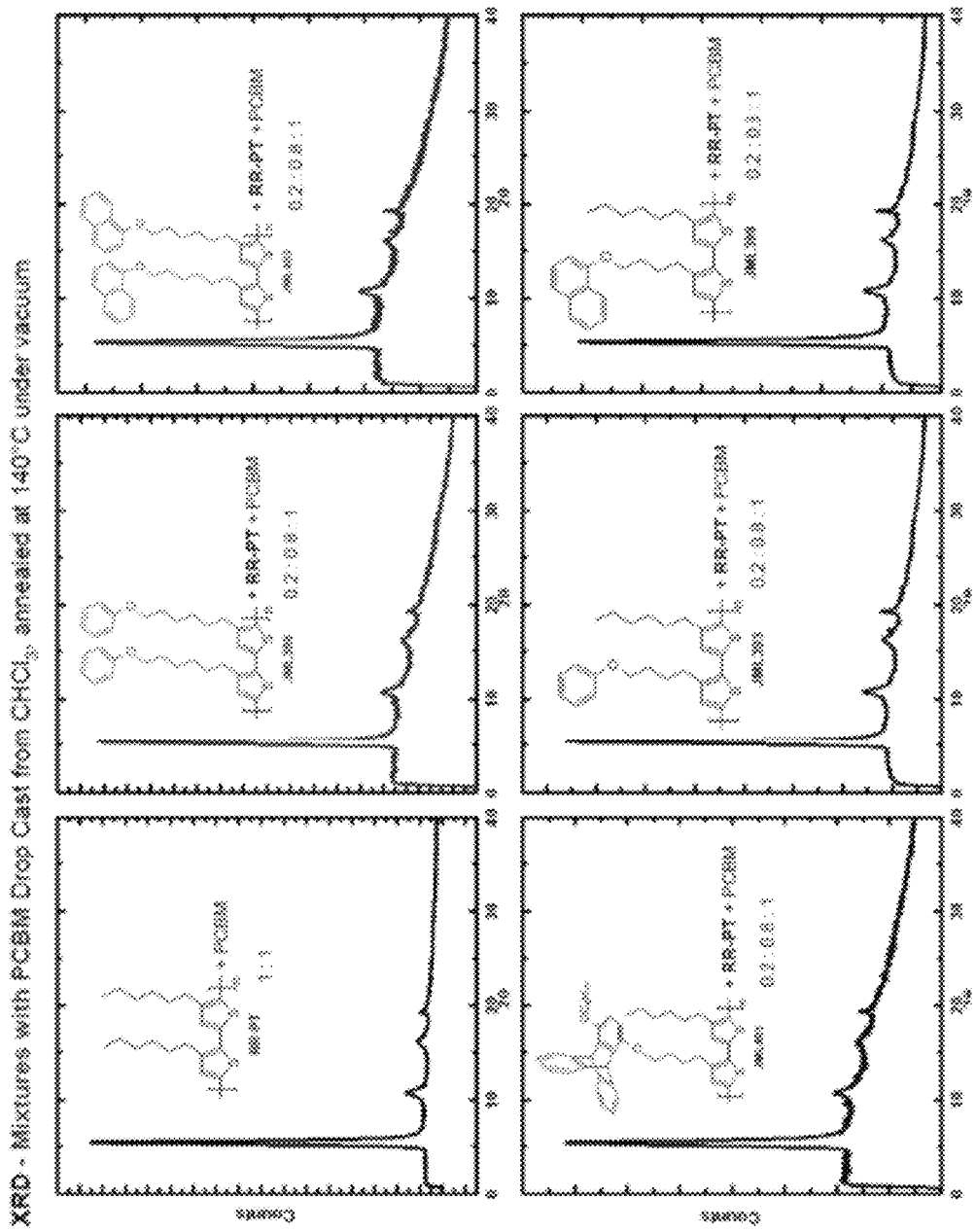
FIG. 20 shows XRD of compositions of the present invention comprising a first poly(thiophene) (e.g., as depicted), a second poly(thiophene) (e.g., P3HT), and an n-type material (e.g., PCBM) at varying ratios (middle, right); and of a system comprising only P3HT and PCBM (left, top).

FIG. 20 shows XRD of compositions of the present invention comprising a first poly(thiophene) (e.g., as depicted), a second poly(thiophene) (e.g., P3HT), and an n-type material (e.g., PCBM) at varying ratio (middle, right); and of a system comprising only P3HT and PCBM (left, top). As shown in this figure, the first poly(thiophene) is a capable of incorporation into the P3HT/PCBM system without disrupting the crystallinity/ordering of the system.

Example 3

Figure 21:
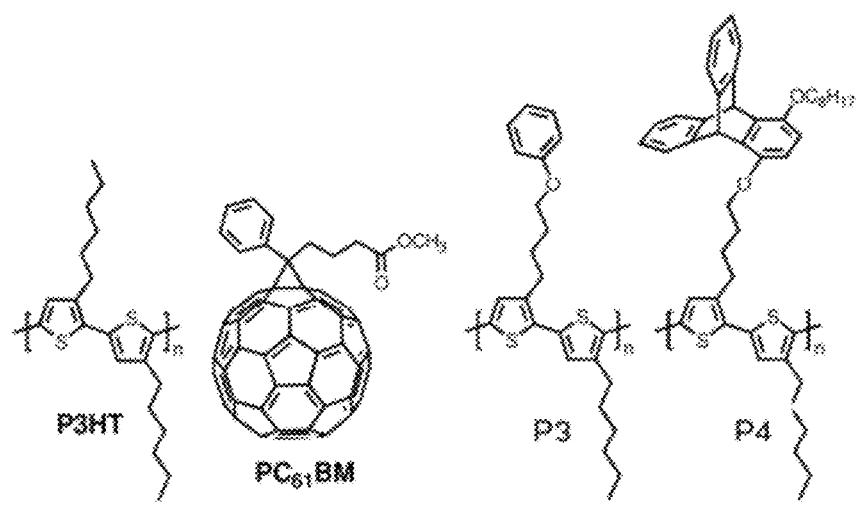
FIG. 21 shows the chemical structures for P3HT, $PC_{61}BM$, and polymer additives P3 and P4.

In this example, additives based on regioregular polythiophenes, where the side chains of the polymer have been functionalized at the termini in every other thiophene unit (P3 and P4, FIG. 21), are utilized. These regioregular additives may improve interactions between the P3HT and PCBM phases and lead to better solar cell efficiencies. Polythiophenes P3 and P4 were synthesized by Grignard metathesis (GRIM) polymerization of corresponding bithienyl. Side chains including triptycene units (P4) were selected for use since triptycene and its derivatives are capable of interacting with fullerene analogues, leading to highly-ordered arrays in the solid state. A polythiophene additive with a simpler, less bulky phenoxy unit in the side chain (P3) was also synthesized for comparison.

Figure 23:
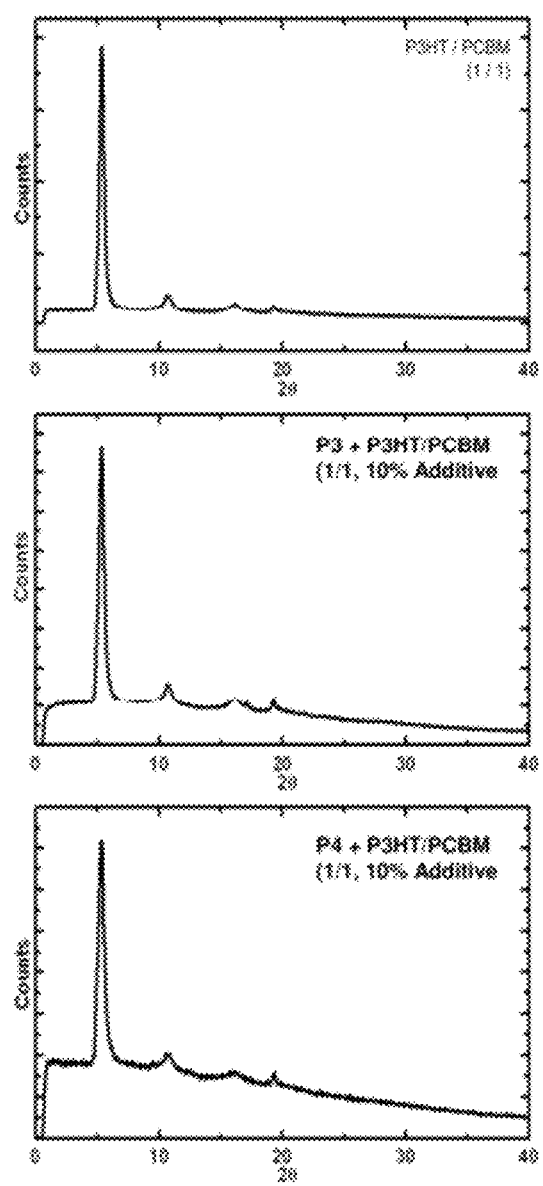
FIG. 23 shows XRD spectra of thin films with compositions comprising poly(thiophene) additives described herein.
Figure 24:
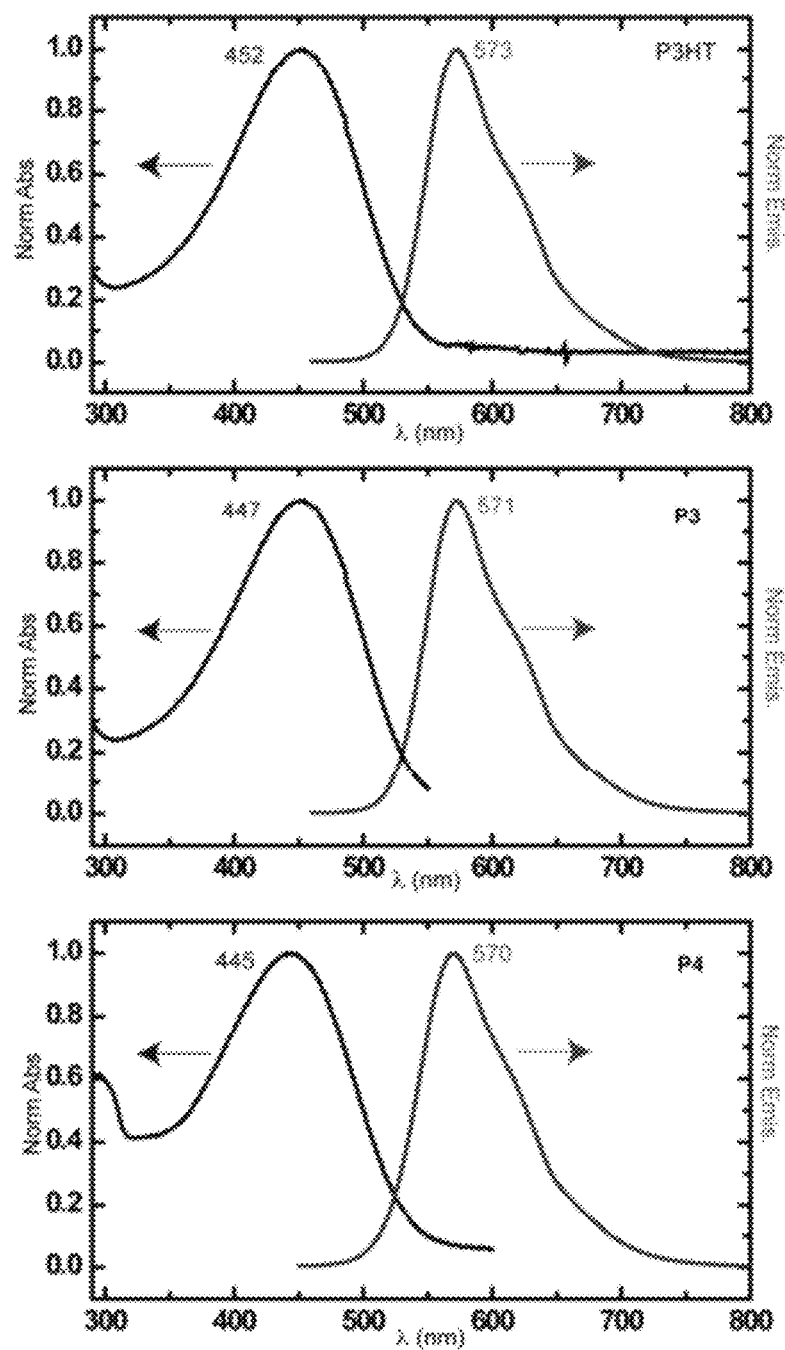
FIG. 24 shows UV-Vis absorption and fluorescence emission spectra of poly(thiophene) additives described herein in chloroform solution.
Figure 25:
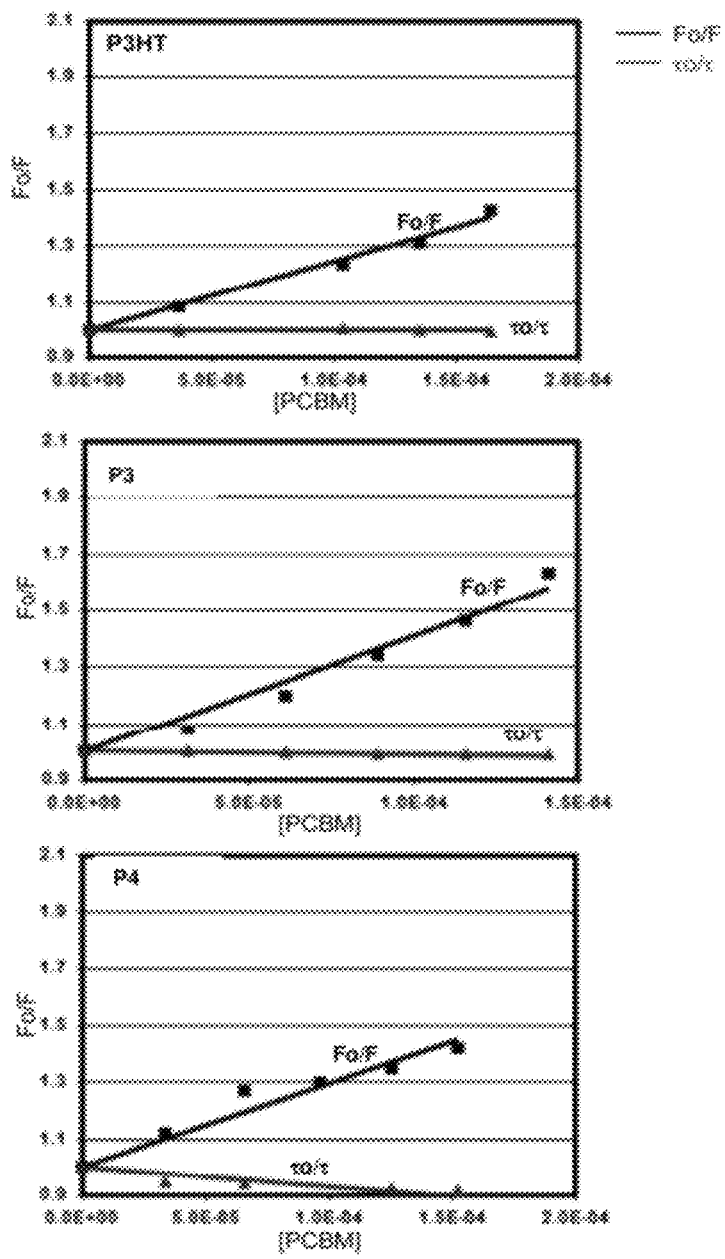
FIG. 25 shows fluorescence quenching Stern-Volmer plots for poly(thiophene) additives described herein in chloroform solution.

X-ray diffraction analysis of P3HT/PC$_{61}$BM blends containing up to 10 wt % of either P3 or P4 (50:50 weight ratio of total polymer to PC$_{61}$BM) revealed that the inclusion of P3 or P4 did not hinder lamellae formation in the crystalline domains of the P3HT phase. (FIG. 23) The absorption and emission spectra of P3 and P4 confirmed that incorporating functional groups at the termini of side-chains had little effect on either the band gap or the effective conjugation length of the polymers. (FIG. 24) Quenching studies in CHCl$_3$ solutions of P3 and P4 with PC$_{61}$BM revealed larger Stern-Volmer constants (K$_{SV}$) than P3HT: $4.1 \times 10^3$ and $3.0 \times 10^3$ M$^{-1}$ for P3 and P4, respectively, compared to $2.4 \times 10^3$ for P3HT (FIG. 25). A higher value of K$_{SV}$ can be correlated with a decrease in the amount of charge recombination of the fluorophore excitons, which in turn implied a higher rate of exciton dissociation caused by a higher degree of interaction between the fluorophore (P3 or P4, in this case) and the quencher (PC$_{61}$BM) when compared to P3HT. The fluorophore lifetime was unchanged for the case of P3HT and P3, which is indicative of a static quenching mechanism. For the case of P4, a slight increase in its excited state lifetime was observed as quencher was added, suggesting conformational changes in the polymer backbone upon introduction of the fullerene. This may be indicative of improved interaction with PC$_{61}$BM owing to the presence of triptycene.

Figure 22:
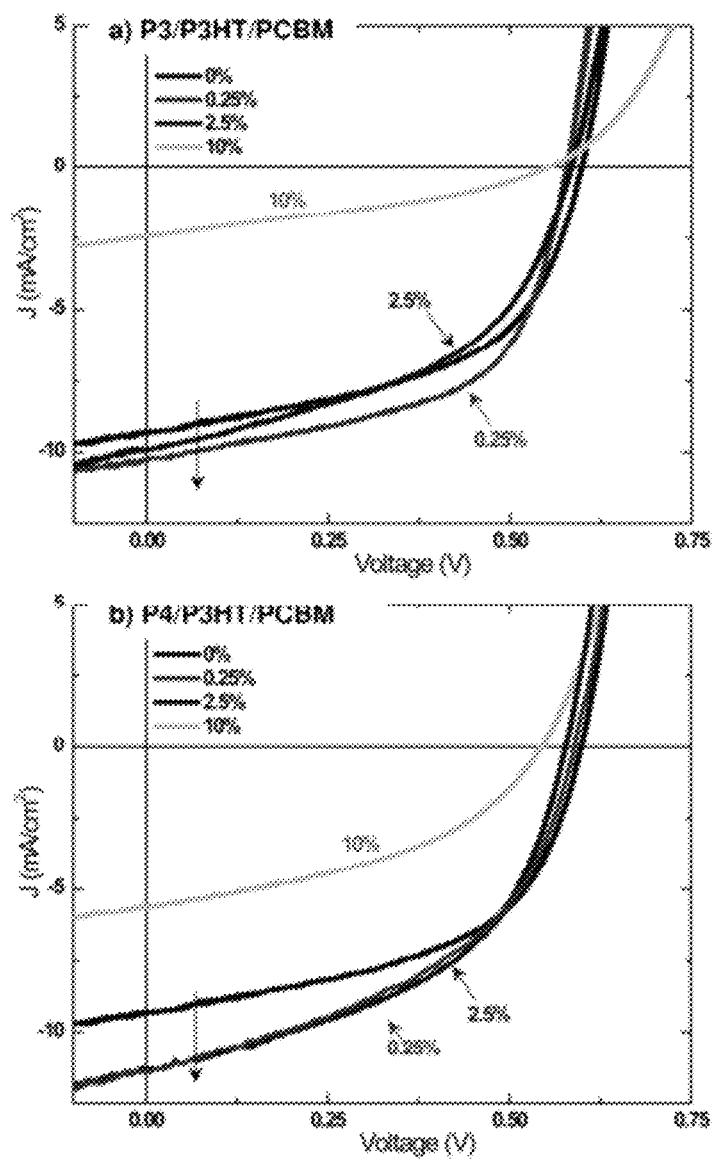
FIG. 22 shows the current (J, $mA/cm^2$)-Voltage (V) curves for BHJ solar cells containing polymer additive/P3HT/$PC_{61}BM$, with a P3HT/$PC_{61}BM$ ratio of 1:1 and various ratios of (a) additive P3 or (b) additive P4.

FIG. 22 shows the current (J, mA/cm$^2$)-Voltage (V) curves for BHJ solar cells with a polymer/PC$_{61}$BM ratio of (1:1). Different ratios of (a) additive P3 or (b) additive P4 were added. The addition of small amounts of P3 or P4 to the P3HT/PC$_{61}$BM BHJ caused an increase in the power conversion efficiency (PCE) of the solar cells, even without extensive optimization. (FIG. 22) When amounts as small as 0.25 weight % of either P3 or P4 were incorporated, higher PCEs were observed, and the improvements were as high as 14% for the case of additive P3 (0.25 weight %) compared to a P3HT/PC$_{61}$BM control. (Table 3) If greater than ca. 5 wt % of P3 or P4 were used, however, a decrease in the PCE was observed for both additives. Similar observations of reduced performance have been noted for other macromolecular additives, and may be attributed to a decrease in the carrier mobilities caused by significant disruptions of the BHJ morphology. Indeed, for higher doping concentrations an increase in the series resistance (see Table 3) was observed, consistent with reduced carrier mobilities.

Figure 26:
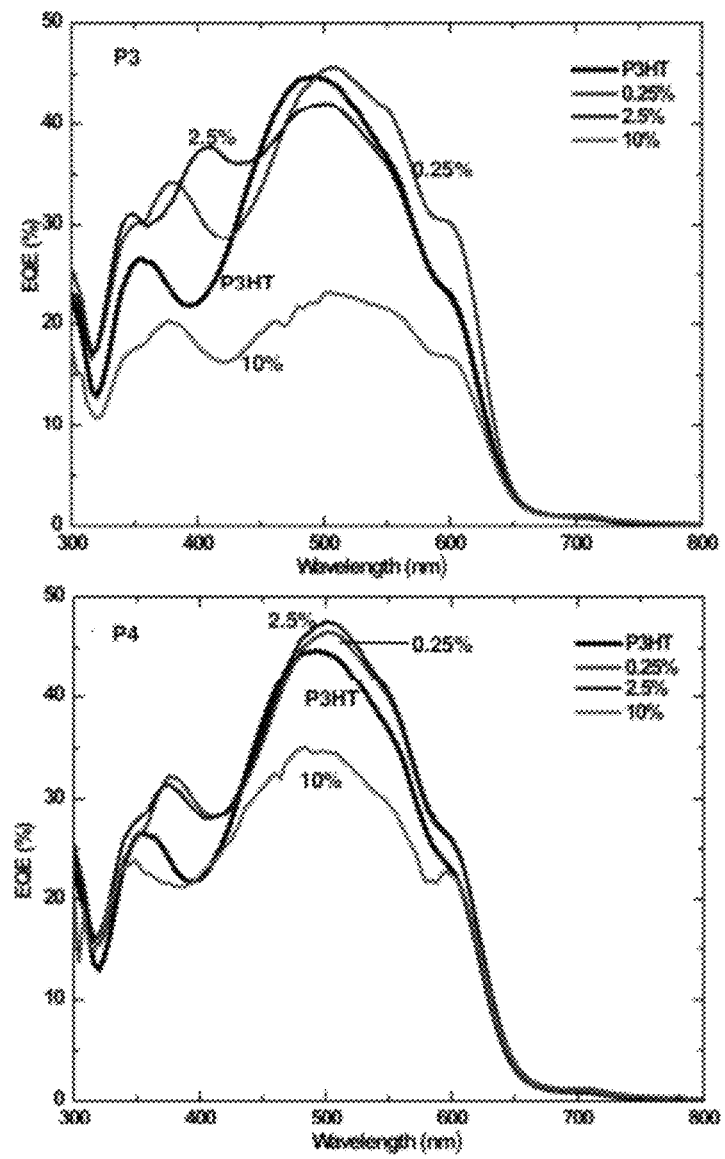
FIG. 26 shows EQEs of solar cells containing different ratios of polymer additives P3 and P4 in the following amounts: 0% (P3HT/PC61BM reference cell), 0.25%, 2.5%, and 10%.
Figure 27:
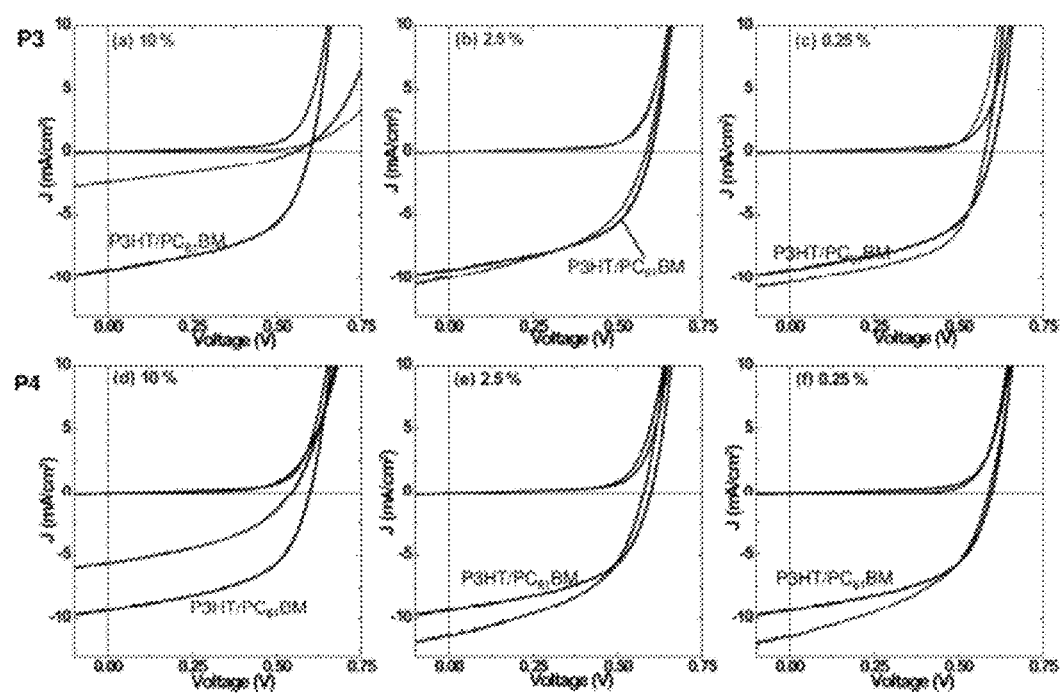
FIG. 27 shows dark and under illumination J-V curves of solar cells containing polymer additive/P3HT/$PC_{61}BM$ and having different ratios of polymer additive P3 (a-c) and P4 (d-f).

The observed increase in the power conversion when using small amounts of either P3 or P4 as additives may be due to an increase in J$_{SC}$ while the V$_{OC}$ and FF remain approximately the same. The increase in the J$_{SC}$ may also be manifested as the increase in the external quantum efficiencies (EQEs) at low additive loadings. (FIG. 24) Since this variation in the EQE cannot be attributed to an increase in light absorption (considering the low additive loadings employed), this effect possibly originated from a decrease in the amount of charge recombination at the heterointerface. The solar cell resistance can be extracted from the slope of the dark current vs. voltage curves (FIGS. 25-26): a higher increasing slope of the dark current-voltage curve at positive voltages may indicate a lower series resistance (R$_s$, Table 3), which in turn can lead to higher mobilities when decreasing the loading of additives P3 or P4. This can be seen more clearly in the log-log representation of the dark current vs. voltage curves, where, as the amount of additive is decreased, the result is higher dark injection currents. (FIG. 27) When using the additives, a higher shunt resistance ($R_{sh}$) was observed, which supports the diminishment of charge carrier recombinations at the interface, leading to an improvement in solar cell performance. From the semilog dark current curves it can be seen that the current in forward bias is much larger than in reverse bias, yielding higher rectifying values.

Polymer molecular weights were determined at room temperature on a HP series 1100 GPC system in THF at 1.0 mL/min (1 mg/mL sample concentrations), approximate molecular weights were estimated using a polystyrene calibration standard. NMR spectra were obtained on a Bruker Avance (400 MHz). NMR chemical shifts are given in ppm referenced to $CHCl_3$/TMS (7.24 ppm for $^1H$, 77.24 ppm for $^{13}C$), unless otherwise noted. High-resolution mass spectra

TABLE 3

Photovoltaic Performance of BHJ Solar Cells with Various Additives at Different Ratios.[a] Short circuit current $J_{SC}$, open circuit voltage ($V_{OC}$), fill factor (FF), series resistance ($R_S$), shunt resistance ($R_{SH}$), and power conversion efficiency (PCE) are indicated.

| Additive (wt %) | $J_{SC}$ (mA/cm$^2$) | $V_{OC}$ (V) | FF | Rs (Ωcm$^2$) | Rsh (Ωcm$^2$) | PCE (%) | PCE % increase |
|---|---|---|---|---|---|---|---|
| — (—) | 9.31 ± 0.21 | 0.60 | 0.53 | 2.6 | 1334 | 2.94 | 0% |
| 3 (10%) | 2.45 ± 0.23 | 0.55 | 0.34 | 21.6 | 51948 | 0.45 | −85% |
| 3 (2.5%) | 9.93 ± 0.22 | 0.59 | 0.48 | 4.1 | 1703 | 2.78 | −5% |
| 3 (0.25%) | 10.30 ± 0.20 | 0.58 | 0.57 | 2.1 | 16021 | 3.36 | 14% |
| 4 (10%) | 5.61 ± 0.23 | 0.54 | 0.43 | 4.9 | 2187 | 1.31 | −55% |
| 4 (2.5%) | 11.40 ± 0.22 | 0.58 | 0.49 | 3.0 | 1376 | 3.18 | 8% |
| 4 (0.25%) | 11.50 ± 0.23 | 0.60 | 0.48 | 3.1 | 1397 | 3.25 | 11% |

[a]Devices were fabricated with a polymer/$PC_{61}BM$ ratio of (1:1). For devices where additive was included, the total polymer (additive + P3HT) to $PC_{61}BM$ weight ratio was 1:1. Device performance was evaluated using AM 1.5 conditions (100 mW/cm2), and results for an average of 8 devices are presented. Error bars are given as the standard deviation on the measurements. The active area of each device was 0.01210 cm$^2$.

Figure 28:
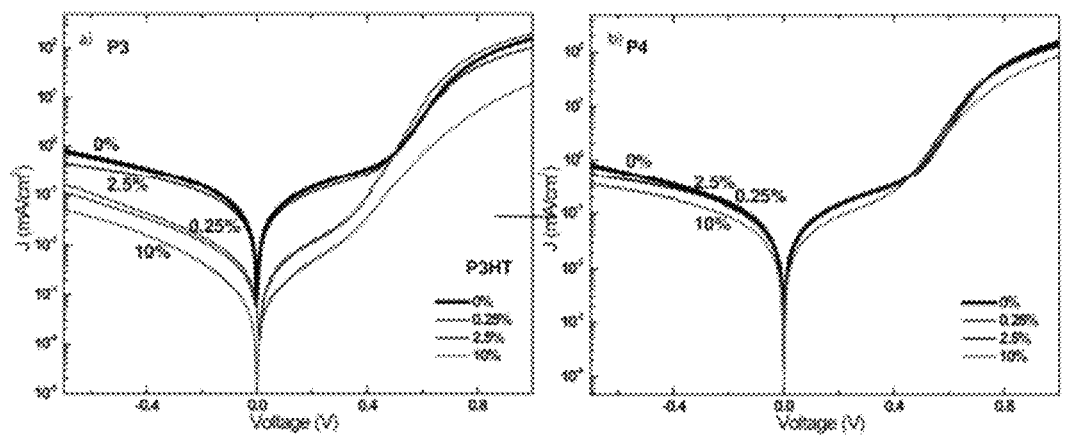
FIG. 28 shows semi-log dark current-voltage curves of solar cells containing different ratios of polymer additive (a) P3 and (b) P4.

To further investigate whether additive incorporation caused a decrease in charge recombination, measurements of the carrier recombination lifetime were conducted on solar cells containing 0.25% weight of each additive. (FIG. 28) Additive incorporation in the blend caused a slower $V_{OC}$ decay, which indicated an increase in charge carrier lifetime. This result can be interpreted as a decrease in the recombination rate across the heterointerface in the presence of additives P3 and P4.

Figure 29:
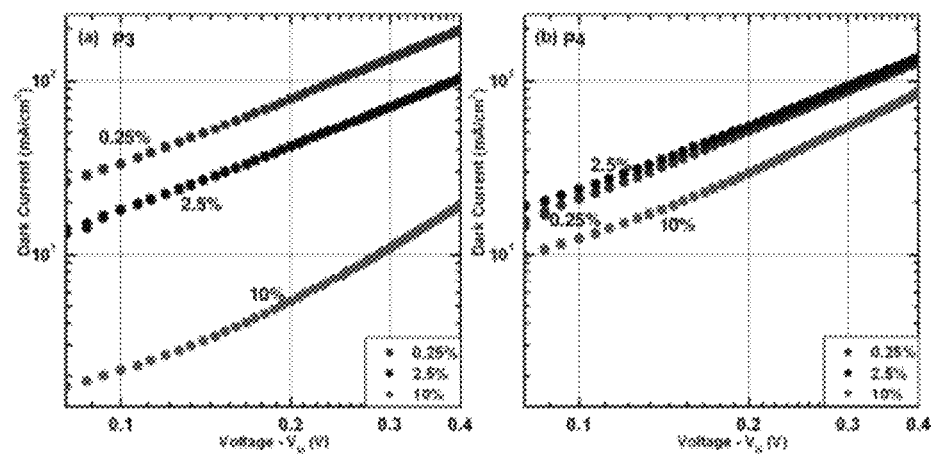
FIG. 29 shows log-log scale representation of curves for the dark current versus voltage (built-in voltage of 0.6 V substracted) of solar cells containing different ratios of polymer additive (a) P3 and (b) P4.
Figure 30:
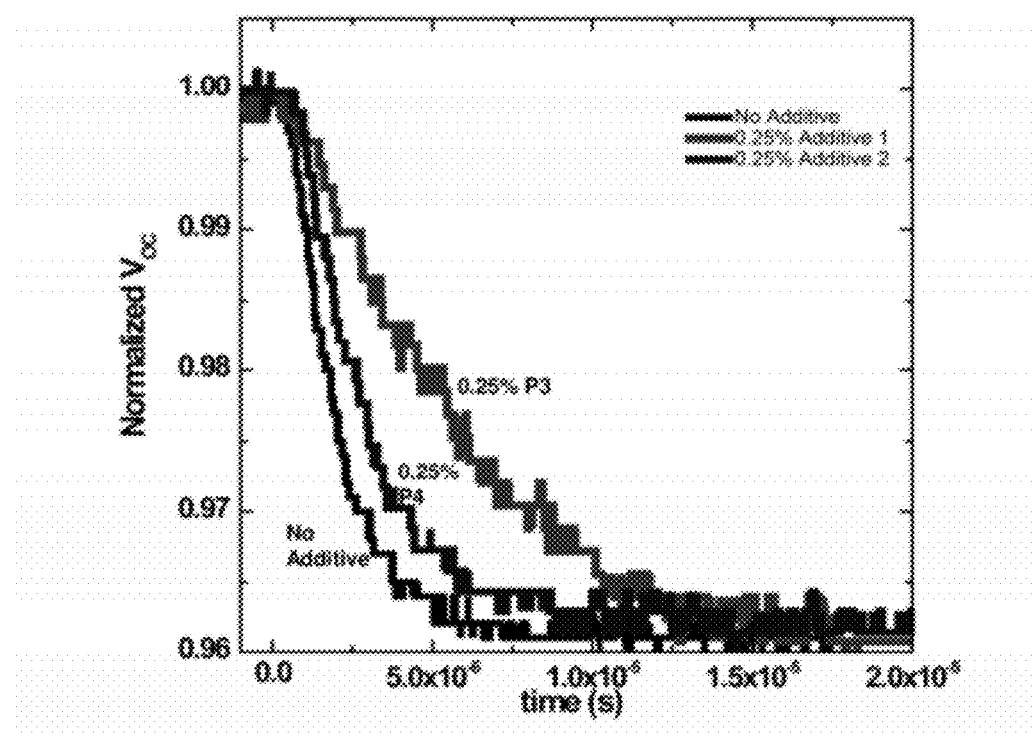
FIG. 30 shows open circuit voltage decay profiles of solar cells containing no additive, 0.25% weight P3, and 0.25% weight % P4.

FIG. 29 shows log-log scale representation of curves for the dark current versus voltage (built-in voltage of 0.6 V substracted) of solar cells containing different ratios of polymer additive (a) P3 and (b) P4. FIG. 30 shows open circuit voltage decay profiles of solar cells containing no additive, 0.25% weight P3, and 0.25% weight % P4.

This example demonstrates a strategy for improving the power conversion efficiencies of polymer PVs. Incorporation of small amounts of side-chain functionalized polythiophene additives (0.25% weight) was shown to result in up to a 14% increase in the PCE without extensive optimization, making this relatively inexpensive approach very attractive from the standpoint of commercial applications. In addition, the inclusion of our additives does not involve deposition of additional layers or extra steps in the fabrication of a solar cell, which can, in turn, lead to more efficient solar cells without an increase in manufacturing costs. Incorporating different functional groups in the side chain of the polythiophene additives can lead to even higher improvements in the efficiency, and since many different derivatives can be readily accessed, a combinatorial approach to solar cell improvement can be envisioned.

Polymer Synthesis and Characterization

Unless otherwise noted, all reactions were performed in flame-dried glassware, and under an oxygen-free atmosphere of argon using standard Schlenck techniques. Anhydrous solvents were obtained using a solvent purification solvent (Innovative Technologies). All other chemicals were of reagent grade from Sigma-Aldrich and were used as received. Regioregular P3HT for XRD, spectroscopic and photovoltaic studies was purchased from Aldrich (electronic grade, 99.995% trace metals basis, average Mn 30,000-60,000).

(FIRMS) were obtained on a Bruker Daltonics APEXII 3 Tesla Fourier Transform Mass Spectrometer at the MIT Department of Chemistry Instrumentation Facility (DCIF).

X-Ray data was collected using an Inel CPS 120 position sensitive detector using an XRG 3000 generator (Cu Ka).

Spectroscopic Studies and Stern-Volmer

UV-Vis spectra were recorded with an Agilent 8453 diode-array or Cary 50 UV-V is spectrophotometer, corrected for baseline with a solvent-filled cuvette. Emission spectra were acquired on a SPEX Fluorolog-t3 fluorimeter. The spectra were obtained at room temperature using a quartz cuvette with a path length of 1 cm at right angle detection. The absorbance of all samples used for fluorescence studies was equal or below 0.1.

The fluorescence quenching properties were investigated by measuring the fluorescence intensity changes of the polymer solutions with the addition of PCBM. PCBM was dissolved in a polymer solution with the same concentration as the initial solution, so that the polymer concentration remained constant throughout the experiment. No new emission bands were observed during the quenching studies. There is a competitive absorption of PCBM at the excitation and emission wavelengths of the studied polythiophenes. To account for this effect, the measured fluorescence was corrected by the following equation:

$$F = F_{em} \times \frac{1 - e^{-\varepsilon_1 C_1 l}}{\varepsilon_1 C_1 l} \times \frac{\varepsilon_1 C_1 l + \varepsilon_2 C_2 l}{1 - e^{-(\varepsilon_1 C_1 + \varepsilon_1 C_1)l}} \times \frac{\varepsilon_3 C_2 l}{1 - e^{-\varepsilon_3 C_2 l}}$$

In this equation, $F_{em}$ denotes the experimental fluorescence intensity, F denotes the corrected fluorescence intensity, $C_1$ is the molar concentration of polythiophene, $C_2$ is the molar concentration of PCBM, $\varepsilon_1$ is the molar extinction coefficient of a polythiophene at its excitation wavelength (452 nm for P3HT), $\varepsilon_2$ is the molar extinction coefficient of PCBM at the excitation wavelength of the polymer (452 nm for P3HT), $\varepsilon_3$ is the molar extinction coefficient of PCBM at the emission maxima of the polymer (573 nm for P3HT), and l is the thickness of the cell.

Solar Cell Measurements

Device Fabrication.

Patterned indium tin oxide (ITO)-coated glass substrates were sonicated in acetone (30 min) and isopropanol (30 min) and oxygen plasma-cleaned (3 min) immediately prior to deposition of the PEDOT:PSS layer. PEDOT:PSS (2-5 wt % in water, Aldrich) was spin-coated in a nitrogen atmosphere at 4000 rpm and annealed at 150° C. (using a hotplate) for 15 min under nitrogen. A 40 nm PEDOT layer was thus obtained. For the active layer, a 10 mg/mL solution of 1:1 total polymer: $PC_{61}BM$ in 1,2-dichlorobenzene was employed (in a representative example, 1.9 mg P3HT, 0.1 mg 1, and 2 mg $PC_{61}BM$ were dissolved in 0.2 mL DCB). 60 μL of this solution was then spin-coated onto the PEDOT layer at 1000 rpm under nitrogen. The substrate was taken from the spin chuck and immediately placed under an inverted Petri dish inside the glovebox for 10 minutes to encourage solvent annealing from the small amount of residual DCB on the substrate. Next, the solar cells were placed on a 150° C. hotplate and annealed for 45 min under nitrogen. An approximately 75 nm active layer was thus obtained. Following this deposition procedure, the top electrode was deposited by evaporation of a 25 nm thick film of Ca followed by 80 nm thick film of Al. Each device had an area of 0.01210 $cm^2$.

Characterization.

The current-voltage characteristics of the devices were measured using a Keithley 6487 sourcemeter. The devices were illuminated through the glass substrate using an Oriel 91191 1000 W full spectrum solar simulator. Spectral mismatch was not corrected for these measurements.

For measurement of external quantum efficiencies, the broadband light from a 1000 W Xe lamp was optically chopped and focused into an Acton Spectrapro 300i monochromator. A calibrated silicon photodetector was used to measure the optical power of the output, which was subsequently focused onto the device under study. A lock-in amplifier provided with the reference signal from the optical chopper (45 Hz) was used to extract a measurement of the AC photocurrent.

For the transient $V_{OC}$ and carrier recombination lifetime measurement, a Newport LQD laser diode (lambda 635 nm) driven by an Agilent 33220A function generator was used as a second light source to provide square wave modulated illumination. This illumination was filtered through a neutral density filter before reaching the device to ensure a small illumination perturbation. VOC decay transients were recorded on a Tektronix TDS 3054B digital oscilloscope with a Tektronix ADA440A high impedance differential preamplifier.

Figure 2A:
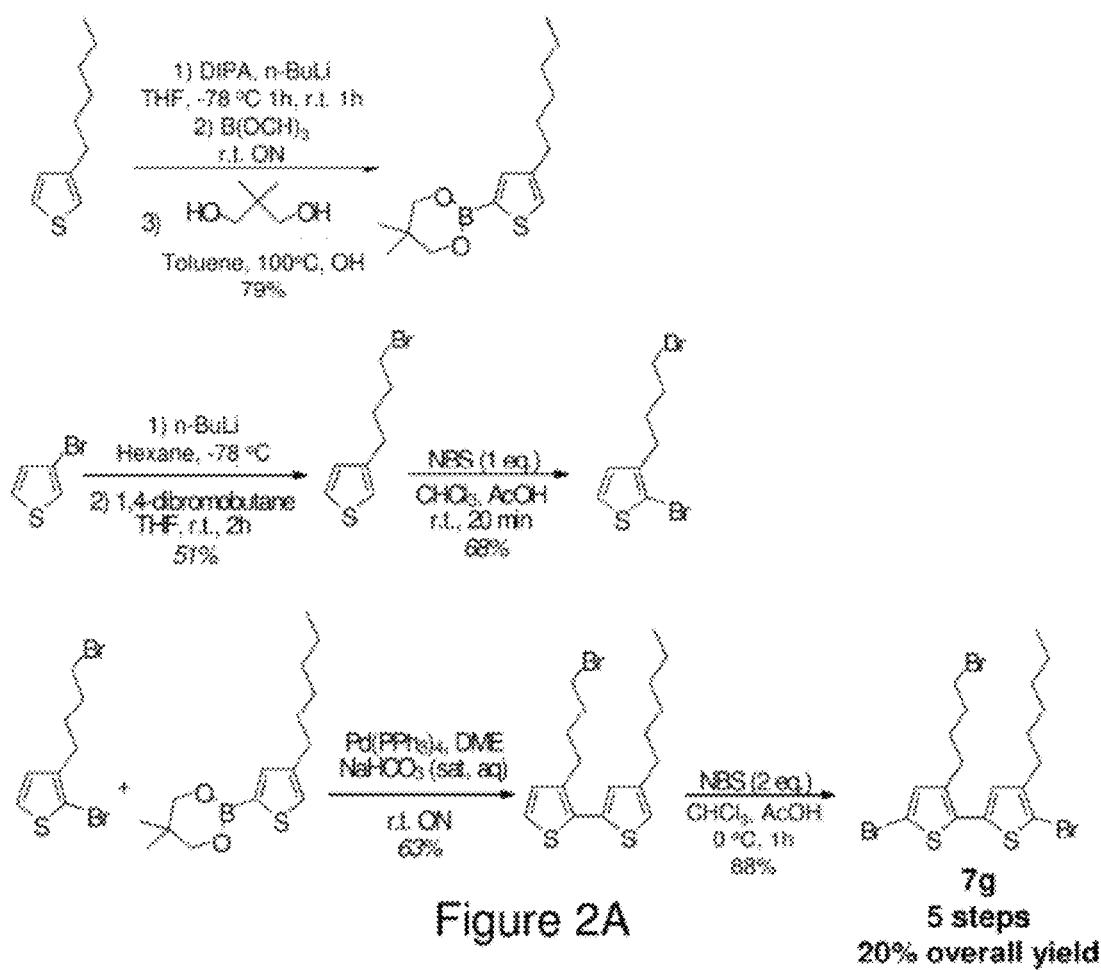
FIGS. 2A-2H show exemplary synthetic routes to non-limiting monomers and polymers.
Figure 2B:
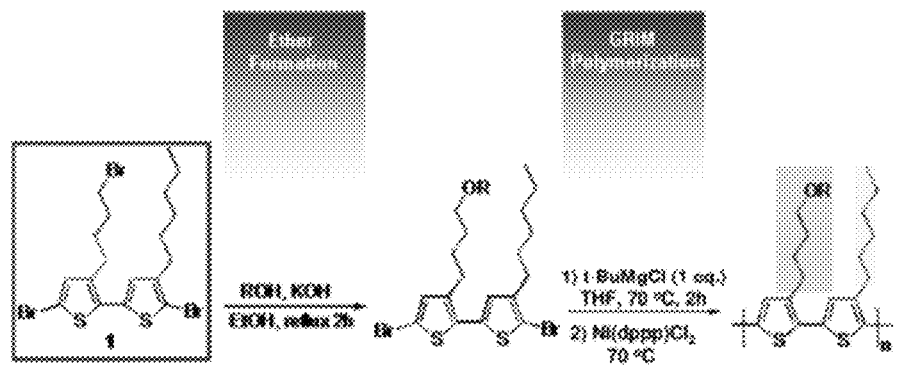
Figure 2C:
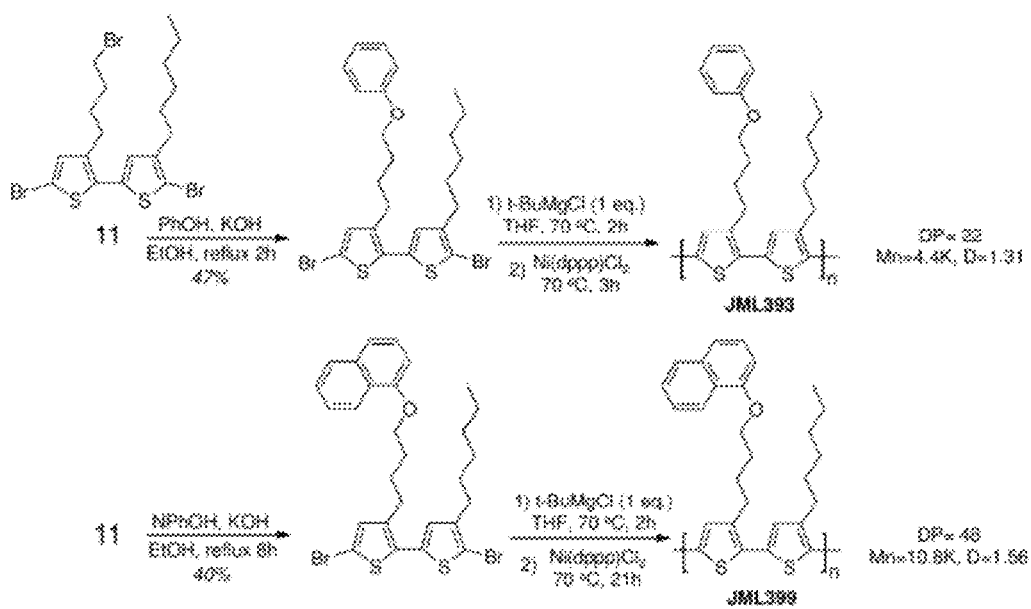
Figure 2D:
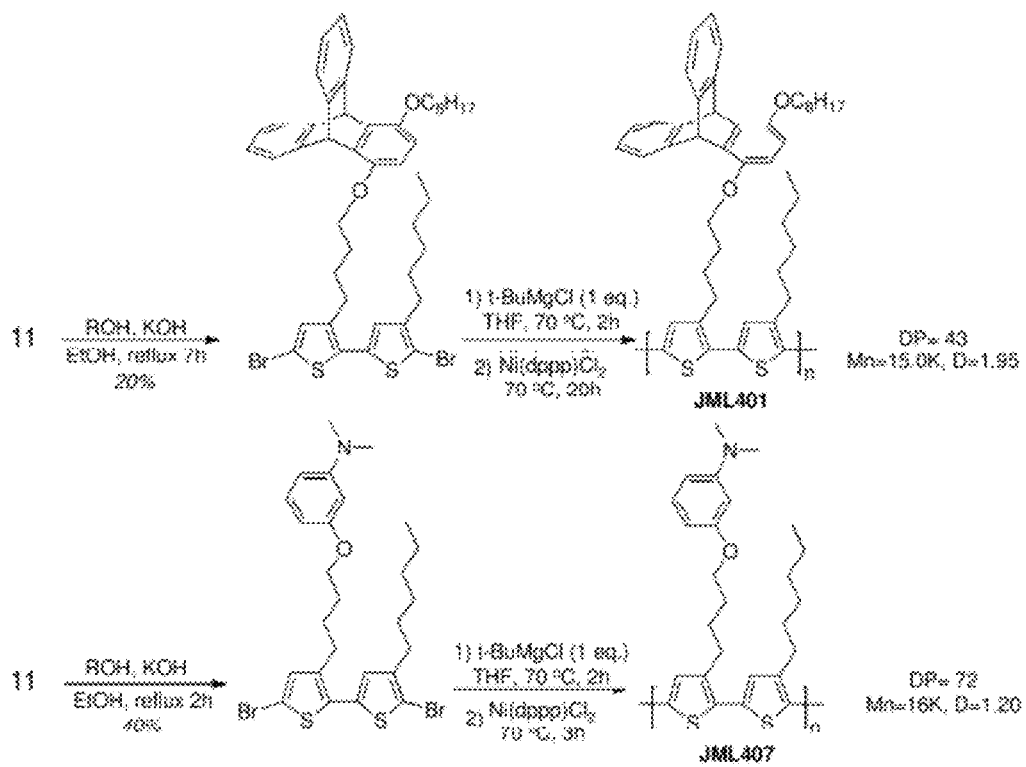
Figure 2E:
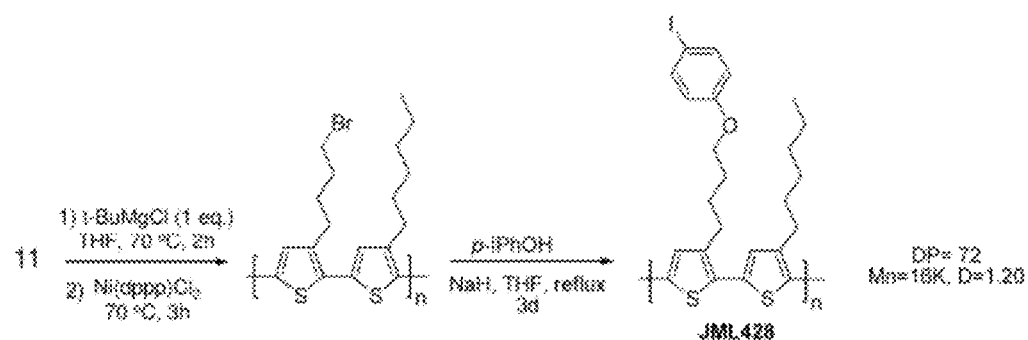
Figure 2F:
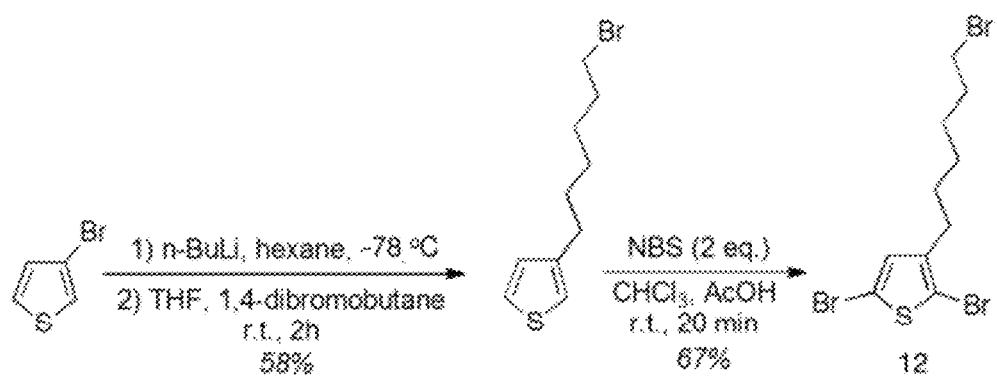
Figure 2G:
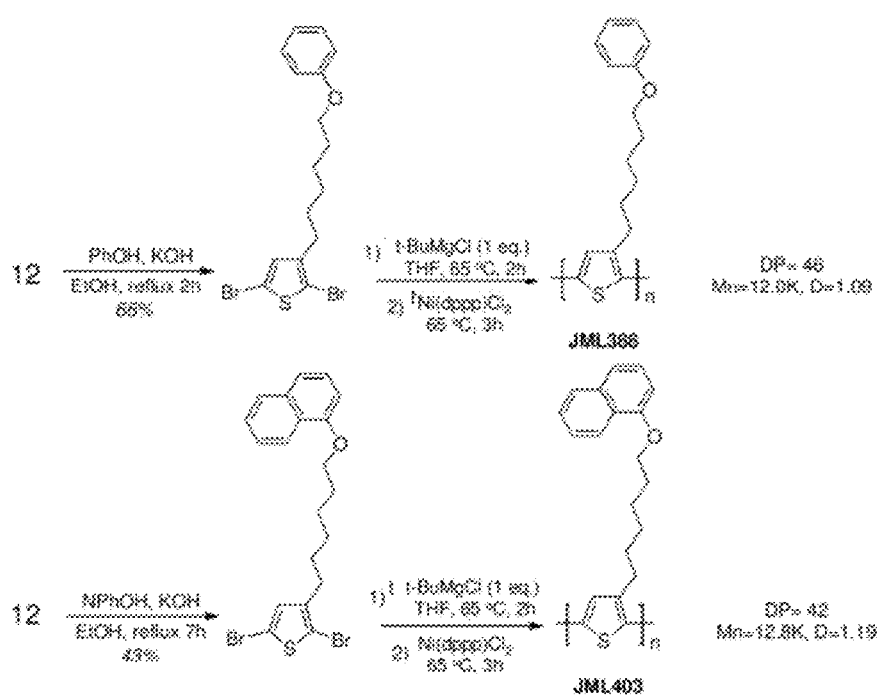
Figure 2H:
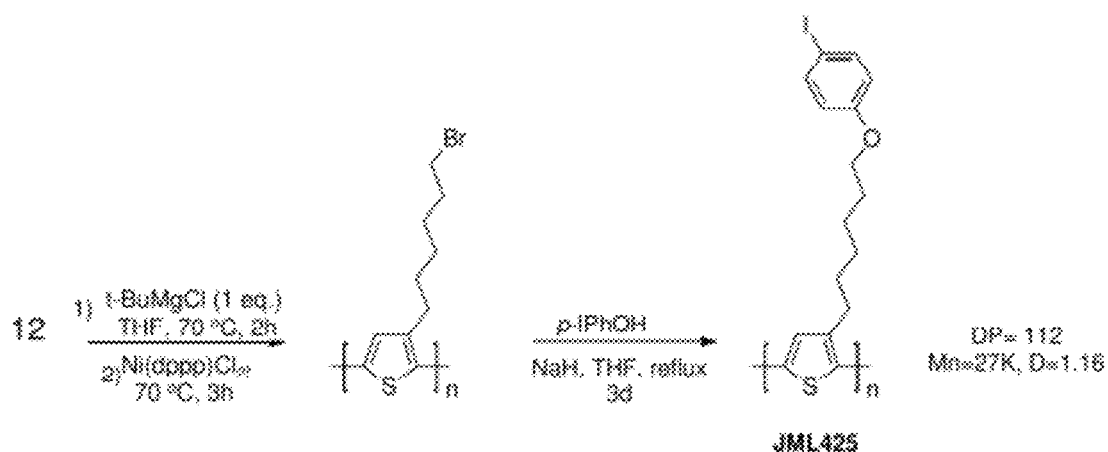
Figure 2I:
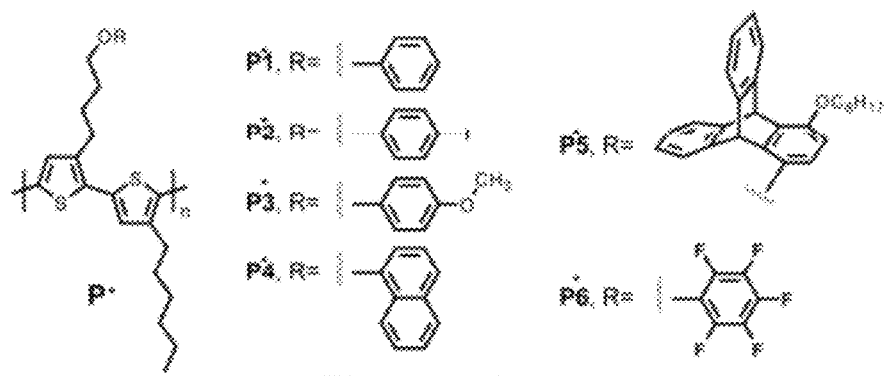
FIG. 2I shows examples of substituted poly(thiophene)s, according to some embodiments.

The monomers and polymers described in this example were synthesized using a similar method as shown in FIGS. 2A-C.

3-(4-bromobutyl)thiophene.

3-bromothiophene (9 ml, 96 mmol) was dissolved in 120 ml dry hexanes. The solution was cooled down to −45° C., and 60 ml n-BuLi (60 ml 1.6M, 96 mmol) were added dropwise. The solution was stirred at −45° C. for 10 min, after which 6 ml dry THF were added and the lithium salt precipitated. After stirring at −45° C. for 1 h, the solution was warmed up to −10° C., and an excess of 1,4-dibromobutane (44 ml, 368 mmol) was added. After stirring at room temperature for 2 h, the solution was extracted with ether, washed with water, brine, dried over magnesium sulfate, and the solvent was removed. Excess 1,4-dibromobutane was removed under vacuum. Posterior filtration of the residue through a silica plug (hexanes), and solvent removal afforded the title compound (10.7 g, 51% yield) as a colorless oil. $^1$H-NMR (ppm, $CDCl_3$): 1.75-1.81 (2H, m), 1.86-1.91 (2H, m), 2.67 (2H, t, J=7.32 Hz), 3.44 (2H, t, J=7.32 Hz), 6.92-6.94 (2H, m), 7.25-7.26 (1H, m); $^{13}$C-NMR (ppm, $CDCl_3$): 29.2, 29.5, 32.4, 33.8, 120.4, 125.6, 128.3, 142.3; ESI-MS (m/z) found: 218.9843 [M+H], calculated: 218.9838.

2-bromo-3-(4-bromobutyl)thiophene.

3-(4-bromobutyl)thiophene (8 g, 36.5 mmol) was dissolved in 250 ml $CHCl_3$, and glacial acetic acid (250 ml) was added in the dark. NBS (6.5 g, 36.5 mmol) was added, and the mixture was stirred for 20 minutes at room temperature in the dark. The reaction mixture was washed with water, saturated $NaHCO_3$, dried over magnesium sulfate and the solvent was removed under vacuum. Purification by column chromatography afforded the title compound (7.4 g, 68% yield) as a light yellow oil. $^1$H-NMR (ppm, $CDCl_3$): 1.71-1.77 (2H, m), 1.85-1.89 (2H, m), 2.6 (2H, t, J=7.44 Hz), 3.43 (2H, t, J=7.32 Hz), 6.78 (1H, d, J=5.6 Hz), 7.19 (1H, d, J=5.6 Hz); $^{13}$C-NMR (ppm, $CDCl_3$): 27.5, 29.4, 32.9, 33.9, 109.2, 125.5, 128.4, 141.8; GC-MS (m/z): 295.89.

2-(4-hexylthiophen-2-yl)-5,5-dimethyl-1,3,2-dioxaborinane.

Diisopropylamine (7 ml, 50 mmol) was dissolved in dry THF (200 ml). The mixture was cooled down to 0° C., at which point n-BuLi (31 ml 1.6 M, 50 mmol) was added. After stirring the mixture at 0° C. for 30 min, it was cooled down to −78° C. and 3-hexylthiophene (8.1 ml, 45 mmol) was added dropwise. After stirring at −78° C. for 1 h the reaction was let warm up to room temperature, and the mixture was stirred for 1 h. Then, the reaction was cooled down to −78° C., and trimethylborate (15 ml, 134 mmol) was added. After 10 min, the reaction was warmed up to room temperature, and stirred overnight. Quenching with 10% $HCl/H_2O$ (40 ml) followed, and the aqueous layer was extracted with ether. The ether phase was washed with water, brine, dried over magnesium sulfate and the solvent was removed under vacuum. 250 ml toluene were added to the remaining oil, followed by neopentyl glycol (7.02 g, 67.4 mmol). The mixture was sparged with argon, and heated up to 100° C. After 24 h, the solvent was removed under reduced pressure. Hexanes were added to the remaining residue, and the hexanes phase was purified by column chromatography (99:1 to 97:3 hexanes:acetone). The product was obtained as a colorless oil (9.9 g, 79% yield). $^1$H-NMR (ppm, $CDCl_3$): 0.85 (3H, t, J=6.24 Hz), 1.00 (6H, s), 1.22-1.33 (6H, m), 1.59 (2H, m), 2.59 (2H, t, J=7.76 Hz), 3.73 (4H, s), 7.13 (1H, s), 7.38 (1H, s); $^{13}$C-NMR (ppm, $CDCl_3$), 14.1, 21.9, 22.6, 29.0, 30.1, 30.6, 31.7, 32.0, 72.4, 122.9, 126.5, 137.0, 144.5; ESI-MS (m/z) found: 218.1742 [M+H], calculated: 218.1753.

3-(4-bromobutyl)-4'-hexyl-2,2'-bithiophene.

A mixture of a saturated solution of $NaHCO_3$ (115 ml) and DME (230 ml) was sparged with argon for 45 minutes. 2-bromo-3-(4-bromobutyl)thiophene (10.4 g, 35 mmol) and 2-(4-hexylthiophen-2-yl)-5,5-dimethyl-1,3,2-dioxaborinane (9.9 g, 35 mmol) were added, followed by addition of $Pd(PPh_3)_4$. After warming up to 80° C., the mixture became first bright yellow, and then dark orange. After stirring at 80° C. for 18 h, a saturated solution of $NH_4Cl$ (aq, 210 ml) was added, and the mixture was extracted with ether. The organic phase was washed with water, a saturated solution of $NaHCO_3$ and brine. After drying over magnesium sulfate and solvent removal, the dark orange oil was purified by column chromatography using hexanes as the eluent. The product (6.07 g, 45% yield) was isolated as a pale yellow oil and used without further purification. $^1$H-NMR (ppm, $CDCl_3$): 0.87 (3H, t, J=6.96 Hz), 1.25-1.36 (6H, m), 1.61 (2H, m), 1.76 (2H, m), 1.88 (2H, m), 2.58 (2H, t, J=8.52 Hz), 2.76 (2H, t, J=7.56 Hz), 3.38 (2H, t, J=6.72 Hz), 6.86-6.93 (3H, m), 7.14 (1H, d, J=5.2 Hz); $^{13}$C-NMR (ppm, $CDCl_3$): 14.1, 21.2, 22.3, 29.0, 29.2, 30.5, 30.7, 31.0, 31.1, 31.8, 121.2, 123.6, 128.1, 129.8, 132.0, 135.5, 137.1; ESI-MS (m/z) found: 385.06, [M+H], calculated: 385.06.

5,5'-dibromo-3-(4-bromobutyl)-4'-hexyl-2,2'-bithiophene.

Compound 3-(4-bromobutyl)-4'-hexyl-2,2'-bithiophene (5.4 g, 14 mmol) was dissolved in 100 ml CHCl₃, and glacial acetic acid (100 ml) was added in the dark. The mixture was cooled down to 0° C., and NBS (4.94 g, 27.75 mmol) was added stepwise. The mixture was stirred for 1 h at 0° C. in the dark. The reaction mixture was washed with water, saturated NaHCO₃, brine, dried over magnesium sulfate and the solvent was removed under vacuum. Purification by column chromatography (hexanes) afforded compound S5 (6.99 g, 92% yield) as a light yellow oil. $^1$H-NMR (ppm, CDCl₃): 0.86 (3H, t, J=7 Hz), 1.22-1.35 (6H, m), 1.53-1.60 (2H, m), 1.67-1.76 (2H, m), 1.83-1.91 (2H, m), 2.52 (2H, t, J=7.8 Hz), 2.65 (2H, t, J=7.72 Hz), 3.38 (2H, t, J=6.6 Hz), 6.72 (1H, s), 6.86 (1H, s); $^{13}$C-NMR (ppm, CDCl₃): 14.3, 22.8, 28.3, 29.1, 29.2, 29.7, 29.8, 32.4, 33.5, 34.9, 109.6, 111.3, 125.7, 127.8, 132.5, 134.2, 139.7, 142.9; ESI-MS (m/z) found: 540.8888 [M+H], calculated: 540.8864.

Synthesis of Polymer Additive P3

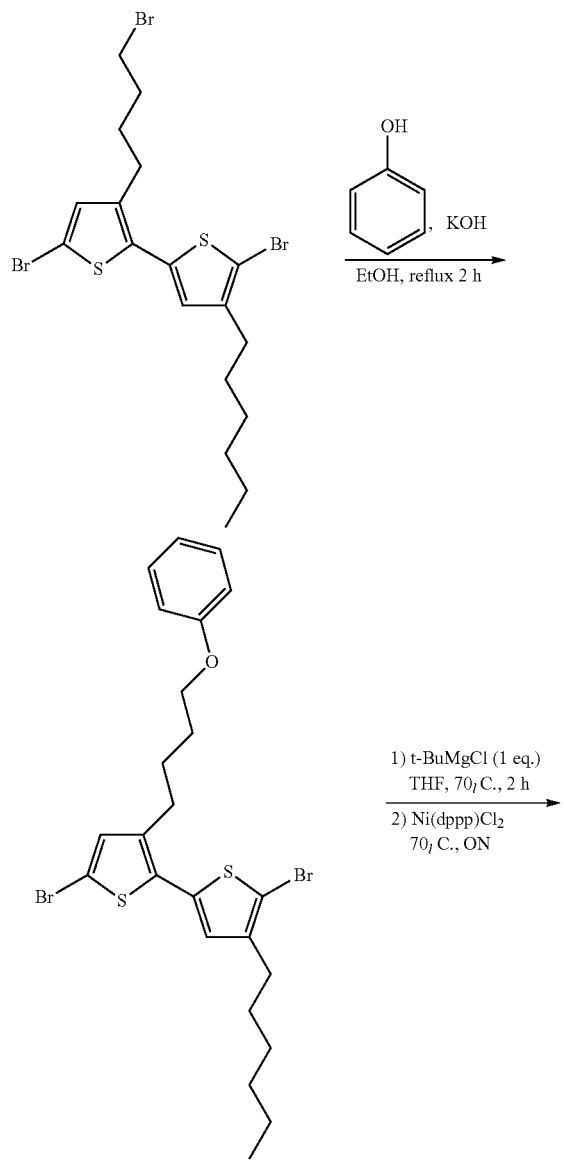

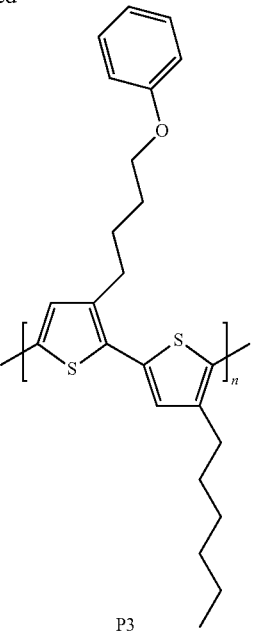

5,5'-dibromo-4'-hexyl-3-(4-phenoxybutyl)-2,2'-bithiophene.

Phenol (208 mg, 2.21 mmol) was dissolved in EtOH (20 ml). After addition of KOH (146 mg, 2.59 mmol) and stirring for 10 minutes, S5 (800 mg, 1.47 mmol) was added. The reaction was brought to reflux, and stirred for 5 h. After addition of H₂O, ether, the mixture was extracted with ether and the combined organic phases were washed with water, brine, dried over magnesium sulfate. After solvent removal, the resulting yellow oil was purified by column chromatography (99:1, hexanes:ethyl acetate) to afford compound M1 as a yellow oil (573 mg, 70% yield). $^1$H-NMR (ppm, CDCl₃): 0.89 (3H, t, J=6.8 Hz), 1.27-1.38 (6H, m), 1.53-1.62 (2H, m), 1.74-1.85 (4H, m), 2.52 (2H, t, J=6.8 Hz), 2.73 (2H, t, J=7 Hz), 3.94 (2H, t, J=6 Hz), 6.74 (1H, s), 6.84-6.97 (4H, m), 7.24-7.30 (2H, m); $^{13}$C-NMR (ppm, CDCl₃): 14.3, 27.3, 28.8, 29.0, 29.0, 29.7, 29.8, 31.8, 67.5, 109.4, 111.1, 114.6, 120.8, 125.6, 127.6, 129.6, 132.7, 134.3, 140.4, 142.8, 159.1; ESI-MS (m/z): found: 578.9839 [M+Na], calculated: 578.9829.

Polymer Additive P3.

5,5'-dibromo-4'-hexyl-3-(4-phenoxybutyl)-2,2'-bithiophene (400 mg, 0.72 mmol) was dissolved in dry THF (8 ml). t-BuMgCl (0.72 ml 1.0 M in THF, 0.72 mmol) was added, and the reaction was warmed up to 70° C. After stirring for 2 h, NidpppCl₂ (5.5 mg, 0.01 mmol) dispersed in 1 ml dry THF was added, and the reaction immediately turned deep orange and fluorescent. After stirring for 10 h, the product was precipitated from an excess of MeOH. The resulting dark purple solid was purified in a Soxhlet with MeOH, acetone and finally extracted with CHCl₃. After solvent removal, the desired polymer was obtained as a deep purple solid (234 mg, 82% yield). Mn=13880, PDI=1.3. $^1$H-NMR (ppm, CDCl₃): 0.88 (3H, b), 1.24-1.50 (6H, mb), 1.61-1.77 (2H, b), 1.77-2.09 (4H, b), 2.7-2.92 (4H, b), 3.98 (2H, b), 6.81-7.02 (5H, m), 7.20-7.25 (2H, b); $^{13}$C-NMR (ppm, CDCl₃): 14.4, 22.9, 27.3, 29.3, 29.5, 29.7, 30.8, 31.9, 32.7, 67.7, 114.7, 120.8, 128.6, 129.1, 129.7, 130.7, 131.4, 133.8, 134.2, 139.4, 140.3, 159.2.

Synthesis of Polymer Additive P4

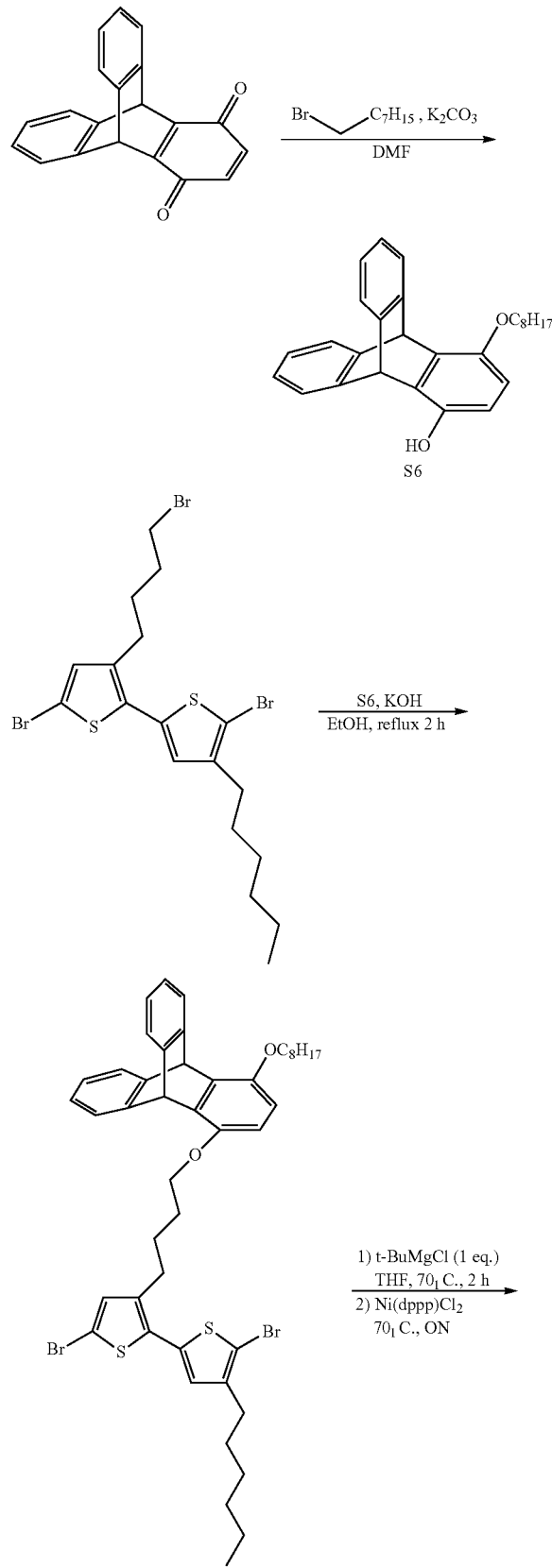

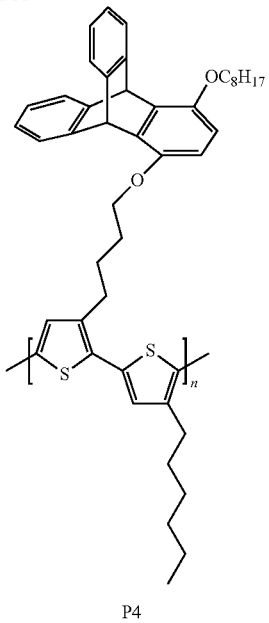

9,10[1',2']-benzene-9,10-dihydro-4-hydroxy-1-octyloxy-anthracene (S6).

To a solution of triptycene hydroquinone (35.8 g, 125 mmol) in 500 ml DMF under Ar was added $K_2CO_3$. 1-bromooctane (25 ml, 125 mmol) was added dropwise over 1.5 hr. The solution was then heated to 50° C. for 24 hours. The solution was then cooled to room temperature and quenched by pouring into dilute aqueous $NH_4Cl$. The product was extracted with $Et_2O$, the combined organic layers washed with dilute aqueous $NH_4Cl$ and brine. The organic layer was then dried over $MgSO_4$, filtered and solvent removed in vacuo to yield a mixture of mono- and di-alkylated triptycenes. The solid is added to 1M NaOH in a 50/50 mixture of EtOH and water. The resulting dark solution is filtered and rinsed on the filter with additional 1M NaOH to yield a white powder (dialkylated, 27.7 g, 43%). The filtrate is acidified with 5% HCl to precipitate the monoalkylated product as a tan powder, which is filtered and dried to yield compound S6 (25.4 g, 51% yield). $^1$H-NMR (400 MHz, $CDCl_3$): 0.91 (3H, t, J=6.8 Hz), 1.54-1.30 (10H, m), 1.82 (2H, m), 3.91 (2H, t, J=6.2 Hz), 4.44 (1H, s), 5.79 (1H, s), 5.87 (1H, s), 6.37 (1H, d, J=8.5 Hz), 6.42 (1H, d, J=8.5 Hz), 6.98 (4H, m), 7.40 (4H, m); $^{13}$C-NMR (400 MHz, $CDCl_3$): 14.3, 22.9, 26.4, 29.6 (3 peaks), 32.1, 47.5, 47.8, 70.0, 111.4, 113.1, 123.8, 123.9, 124.0, 124.1, 125.1, 125.3, 133.3, 136.1, 144.6, 145.7, 145.8, 148.7. ESI-MS (m/z) found: 399.2323 [M+H], calculated: 399.2319.

5,5'-dibromo-4'-hexyl-3-(4-(((9s,10s)-4-(octyloxy)-9,10-dihydro-9,10-[1,2]benzenoanthracen-yl)oxy)butyl)-2,2'-bithiophene.

9,10[1',2']-benzene-9,10-dihydro-4-hydroxy-1-octyloxy-anthracene (880 mg, 2.21 mmol) was dissolved in EtOH (20 ml). After addition of KOH (146 mg, 2.59 mmol) and stirring for 10 minutes, S5 (800 mg, 1.47 mmol) was added. The reaction was brought to reflux, and stirred for 5 h. After addition of $H_2O$, ether, the mixture was extracted with ether and the combined organic phases were washed with water, brine, dried over magnesium sulfate. After solvent removal, the resulting yellow oil was purified by column chromatography (75:25 to 50:50, hexanes:toluene) to afford the title compound as a yellow oil (822 mg, 65% yield). $^1$H-NMR (ppm, $CDCl_3$), 0.88-1.01 (6H, m), 1.30-1.45 (16H, m), 1.52-

1.65 (2H, m), 1.88 (6H, m), 2.54 (2H, 7, J=7.8 Hz), 2.82 (2H, t, J=6.84 Hz), 3.96 (4H, t, J=6.2 Hz), 5.88 (1H, s), 5.92 (1H, s), 6.49 (2H, m), 6.80 (1H, s), 6.92 (1H, s), 7.0 (4H, m), 7.40 (4H, m); $^{13}$C-NMR (ppm, $CDCl_3$), 14.3, 14.4, 22.8, 23.0, 26.5, 27.4, 28.9, 29.1, 29.2, 29.6, 29.6, 29.7, 29.7, 29.8, 31.8, 32.1, 47.7, 47.7, 69.1, 69.8, 109.5, 110.5, 110.8, 111.1, 123.9, 125.1, 125.1, 127.6, 128.4, 129.2, 131.4, 132.1, 132.7, 134.4, 135.8, 135.9, 140.2, 142.8, 145.9, 146.0, 146.0, 148.4. ESI-MS (m/z) found: 883.1674, [M+Na], calculated: 883.1663.

Polymer Additive P4.

5,5'-dibromo-4'-hexyl-3-(4-(((9s,10s)-4-(octyloxy)-9,10-dihydro-9,10-[1,2]benzenoanthracen-1-yl)oxy)butyl)-2,2'-bithiophene (400 mg, 0.72 mmol) was dissolved in dry THF (8 ml). t-BuMgCl (0.72 ml 1.0 M in THF, 0.72 mmol) was added, and the reaction was warmed up to 70° C. After stirring for 2 h, $NidpppCl_2$ (5.5 mg, 0.01 mmol) dispersed in 1 ml dry THF was added, and the reaction immediately turned deep orange and fluorescent. After stirring for 10 h, the product was precipitated from an excess of MeOH. The resulting dark purple solid was purified in a Soxhlet with MeOH, acetone and finally extracted with $CHCl_3$. After solvent removal, the desired polymer was obtained as a deep purple solid (429 mg, 85% yield). Mn=18820, PDI=1.4. $^1$H-NMR (ppm, $CDCl_3$): 0.78-0.93 (6H, m), 1.20-1.53 (16H, m), 1.57-1.72 (2H, mb), 1.72-1.95 (6H, m), 2.76 (2H, sb), 2.89 (2H, sb), 3.80-3.93 (4H, m), 5.81 (2H, sb), 6.40 (2H, sb), 6.80-6.94 (4H, m), 6.96-7.48 (2H, m), 7.25-7.36 (4H, m); $^{13}$C-NMR (ppm, $CDCl_3$): 14.4, 14.4, 22.9, 23.0, 26.4, 27.4, 29.2, 29.3, 29.4, 29.5, 29.6, 29.6, 29.7, 30.8, 31.2, 32.1, 47.7, 47.7, 69.4, 69.8, 110.7, 110.8, 123.9, 123.9, 125.1, 128.0, 128.4, 129.0, 130.8, 131.3, 133.7, 134.3, 135.0, 135.9, 136.0, 139.0, 140.2, 145.9, 145.9, 146.0, 148.5, 148.7.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:
1. A composition, comprising:
an n-type material;
a first poly(thiophene), wherein the first poly(thiophene) is a regioregular copolymer having an alternating A/B pattern; and
a second poly(thiophene) that is different from the first poly(thiophene).

2. A composition, comprising:

a first polymeric material, having the structure:

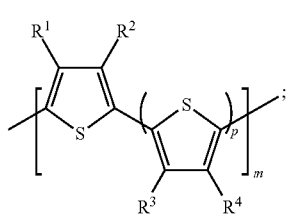

a second polymeric material, having the structure:

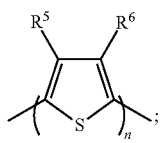

and an n-type material, wherein $R^1$ and $R^2$ can be the same or different and each can independently be hydrogen, alkyl, heteroalkyl aryl, heteroaryl, arylalkyl, arylheteroalkyl, heteroarylalkyl, each optionally substituted, provided at least one of $R^1$ and $R^2$ is not hydrogen;

$R^3$, $R^4$, $R^5$, and $R^6$ can be the same or different and each can independently be hydrogen, alkyl, heteroalkyl, cycloalkyl, or heterocycloalkyl, each optionally substituted; and n and m can be the same or different and can be any integers between 2 and 100,000,000; and p is 1, 3, or 5.

3. A composition, comprising:

an n-type material;

a first poly(thiophene), functionalized with an electron-donating and/or an electron-accepting moiety, selected to be capable of interacting electrochemically with the n-type material; and a second poly(thiophene) that is different from the first poly(thiophene).

4. A photovoltaic cell comprising:

a composition of claim 1.

5. A composition of claim 2, wherein $R^1$ and $R^2$ can be the same or different and each can independently be hydrogen, aryl, heteroaryl, arylalkyl, arylheteroalkyl, heteroarylalkyl, each optionally substituted, provided at least one of $R^1$ and $R^2$ is not hydrogen.

6. A composition of claim 2, wherein each $R^1$ and each $R^3$ is H, and/or each $R^5$ is H.

7. A composition of claim 2, wherein $R^1$ is H and $R^2$ is aryl, heteroaryl, arylalkyl, arylheteroalkyl, heteroarylalkyl, optionally substituted.

8. A composition of claim 2, wherein $R^3$ is H and $R^4$ is alkyl, heteroalkyl, cycloalkyl, or heterocycloalkyl, optionally substituted.

9. A composition of claim 2, wherein $R^3$ is H and $R^4$ is alkyl, optionally substituted.

10. A composition of claim 2, wherein $R^3$ is H and $R^4$ is hexyl.

11. A composition of claim 2, wherein $R^1$ is H and $R^2$ is:

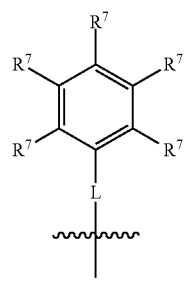

wherein L is a linking group and each $R^7$ can be the same or different and is hydrogen, alkyl, aryl, heteroalkyl, heteroaryl, each optionally substituted.

12. A composition of claim 11, wherein $R^1$ is H and $R^2$ is -L-X-aryl, wherein L is a linking group, X is a heteroatom, optionally present, and aryl is an aryl group, optionally substituted.

13. A composition of claim 11, wherein L is alkyl or heteroalkyl.

14. A composition of claim 11, wherein L is $(CH_2)_w$, wherein w is an integer between 1 and 24, or between 2 and 24, or between 1 and 12, or between 2 and 12, or between 4 and 10.

15. A composition of claim 12, wherein X is O, N, or S.

16. A composition of claim 1, wherein $R^1$ is H and $R^2$ is:

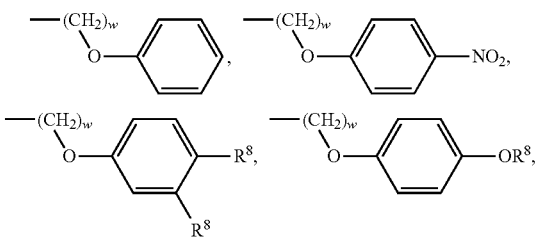

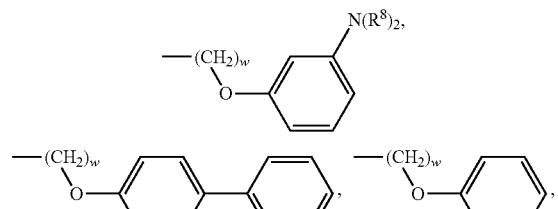

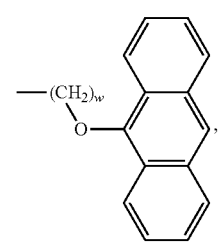

-continued

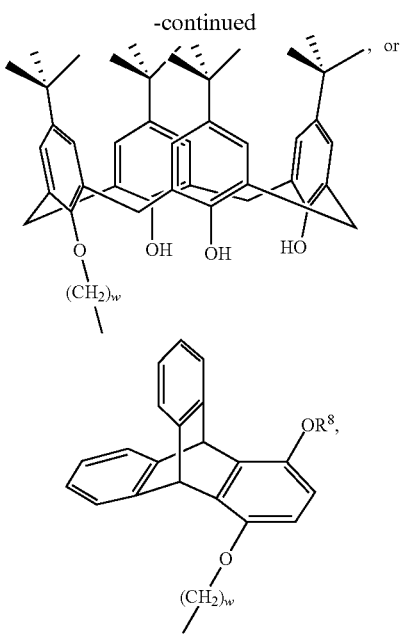

wherein $R^8$ is alkyl, optionally substituted, and w is between 1 and 12, or between 2 and 12, or between 4 and 10.

17. A composition of claim 16, wherein at least one additional hydrogen on any aryl ring of the groups may be optionally substituted.

18. A composition of claim 2, wherein $R^1$ is H and $R^2$ is:

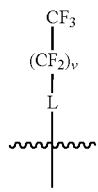

wherein v is at least 4; and
L is a linking group.

19. A composition of claim 2, wherein n and m are the same or different and are an integer between 10 and 1,000,000.

20. A composition of claim 2, wherein p is 1 or 3.

21. A composition of claim 1, wherein the second poly (thiophene) is a homopolymer.

22. A composition of claim 21, wherein the second poly (thiophene) is functionalized at least the 3- or 4-position with alkyl, heteroalkyl, cycloalkyl, or heterocycloalkyl, optionally substituted.

23. A composition of claim 1, wherein the second poly (thiophene) is a poly(3-alkyl-thiophene).

24. A composition of claim 1, wherein the second poly (thiophene) is poly(3-hexylthiophene).

25. A composition of claim 1, wherein first poly (thiophene) and the second poly(thiophene) are present in a ratio of about 0.05:0.95 based on weight.

26. A composition of claim 1, wherein the first poly (thiophene) and the second poly(thiophene) are present in a ratio between about 0.01:0.99 and about 0.5:0.5 based on weight.

27. A composition of claim 1, wherein the degree of regioregularity of the first poly(thiophene) is greater than about 80%.

28. A composition of claim 1, wherein the n-type materials is selected from the group consisting of fullerenes, inorganic nanoparticles, oxadiazoles, discotic liquid crystals, carbon nanorods, inorganic nanorods, polymers containing moieties capable of accepting electrons or forming stable anions, or combinations thereof.

29. A composition of claim 1, wherein the n-type material comprises a fullerene, optionally substituted.

30. A composition of claim 1, wherein the n-type material is phenyl-$C_{61}$-butyric acid methyl ester.

31. A composition of claim 1, wherein the ratio of total poly(thiophene):n-type material is between about 0.5:2 to about 2:0.5 based on weight.

32. A composition of claim 1, wherein the ratio of total poly(thiophene):n-type material is about 1:1.

33. A photovoltaic cell of claim 4, further comprising at least two electrodes.

34. A photovoltaic cell of claim 33, wherein the composition is positioned between the two electrodes.

35. A photovoltaic cell of claim 4, wherein the composition is formed as a film.

36. A photovoltaic cell of claim 35, wherein the thickness of the film is between about 1 nm and about 1 mm.

37. A composition, comprising:
a first polymeric material, having the structure:

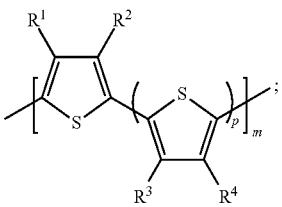

a second polymeric material, having the structure:

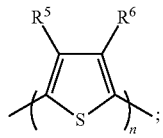

and
an n-type material,
wherein $R^1$ and $R^2$ can be the same or different and each can independently be hydrogen, alkyl, heteroalkyl aryl, heteroaryl, arylalkyl, arylheteroalkyl, heteroarylalkyl, each optionally substituted, provided at least one of $R^1$ and $R^2$ is not hydrogen;
$R^3$ is H and $R^4$ is alkyl, heteroalkyl, cycloalkyl, or heterocycloalkyl, optionally substituted;
$R^5$ and $R^6$ can be the same or different and each can independently be hydrogen, alkyl, heteroalkyl, cycloalkyl, or heterocycloalkyl, each optionally substituted; and
n and m can be the same or different and can be any integers between 2 and 100,000,000; and
p is 1, 3, or 5.

38. A composition, comprising:
an n-type material;
a first poly(thiophene), wherein the first poly(thiophene) is a regioregular copolymer having an alternating A/B pattern and the degree of regioregularity of the first poly (thiophene) is greater than about 80%; and
a second poly(thiophene) that is different from the first poly(thiophene).

* * * * *